(12) United States Patent
Ganesan et al.

(10) Patent No.: US 11,640,942 B2
(45) Date of Patent: May 2, 2023

(54) MICROELECTRONIC COMPONENT HAVING MOLDED REGIONS WITH THROUGH-MOLD VIAS

(71) Applicant: Intel Corporation, Santa Clara, CA (US)

(72) Inventors: Sanka Ganesan, Chandler, AZ (US); Ram Viswanath, Phoenix, AZ (US); Xavier Francois Brun, Hillsboro, OR (US); Tarek A. Ibrahim, Mesa, AZ (US); Jason M. Gamba, Gilbert, AZ (US); Manish Dubey, Chandler, AZ (US); Robert Alan May, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/677,130

(22) Filed: Feb. 22, 2022

(65) Prior Publication Data

US 2022/0181262 A1 Jun. 9, 2022

Related U.S. Application Data

(63) Continuation of application No. 16/829,396, filed on Mar. 25, 2020, now Pat. No. 11,302,643.

(51) Int. Cl.
*H01L 23/538* (2006.01)
*H01L 23/367* (2006.01)
*H01L 23/31* (2006.01)
*H01L 23/00* (2006.01)

(52) U.S. Cl.
CPC ...... *H01L 23/5381* (2013.01); *H01L 23/3185* (2013.01); *H01L 23/367* (2013.01); *H01L 23/5384* (2013.01); *H01L 23/5386* (2013.01); *H01L 24/16* (2013.01); *H01L 2224/16227* (2013.01)

(58) Field of Classification Search
CPC ............ H01L 23/5381; H01L 23/3185; H01L 23/367; H01L 23/5384; H01L 23/5386; H01L 24/16; H01L 2224/16227
See application file for complete search history.

(56) References Cited

U.S. PATENT DOCUMENTS

| | | | |
|---|---|---|---|
| 7,402,901 | B2 | 7/2008 | Hatano |
| 8,901,748 | B2 | 12/2014 | Manusharow et al. |
| 9,275,955 | B2 | 3/2016 | Mahajan et al. |
| 2014/0102772 | A1 | 4/2014 | Chen et al. |
| 2016/0205778 | A1 | 7/2016 | Lin et al. |
| 2017/0011993 | A1 | 1/2017 | Zhao et al. |
| 2017/0040264 | A1 | 2/2017 | Qian et al. |

(Continued)

*Primary Examiner* — Peniel M Gumedzoe
(74) *Attorney, Agent, or Firm* — Schwabe, Williamson & Wyatt P.C.

(57) ABSTRACT

Microelectronic assemblies, related devices and methods, are disclosed herein. In some embodiments, a microelectronic component may include a substrate having a first face and an opposing second face, wherein the substrate includes a through-substrate via (TSV); a first mold material region at the first face, wherein the first mold material region includes a first through-mold via (TMV) conductively coupled to the TSV; and a second mold material region at the second face, wherein the second mold material region includes a second TMV conductively coupled to the TSV.

20 Claims, 12 Drawing Sheets

(56) References Cited

U.S. PATENT DOCUMENTS

2018/0211929 A1\* 7/2018 Bae .................... H01L 24/17
2018/0240778 A1   8/2018 Liu et al.
2019/0131273 A1   5/2019 Chen et al.

\* cited by examiner

MICROELECTRONIC COMPONENT HAVING MOLDED REGIONS WITH THROUGH-MOLD VIAS

CROSS REFERENCE TO RELATED APPLICATIONS

This Application is a continuation (and claims the benefit of priority under 35 U.S.C. § 120) of U.S. application Ser. No. 16/829,396, filed Mar. 25, 2020 and entitled "MICROELECTRONIC COMPONENT HAVING MOLDED REGIONS WITH THROUGH-MOLD VIAS". The disclosure of the prior Application is considered part of and is incorporated by reference in the disclosure of this Application.

BACKGROUND

Integrated circuit (IC) packages may include an embedded multi-die interconnect bridge (EMIB) for coupling two or more IC dies or to provide specific functionality like memory or power management. These ultra-thin EMIBs are susceptible to damage during embedding in IC packages and to warpage during operation of the IC package.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
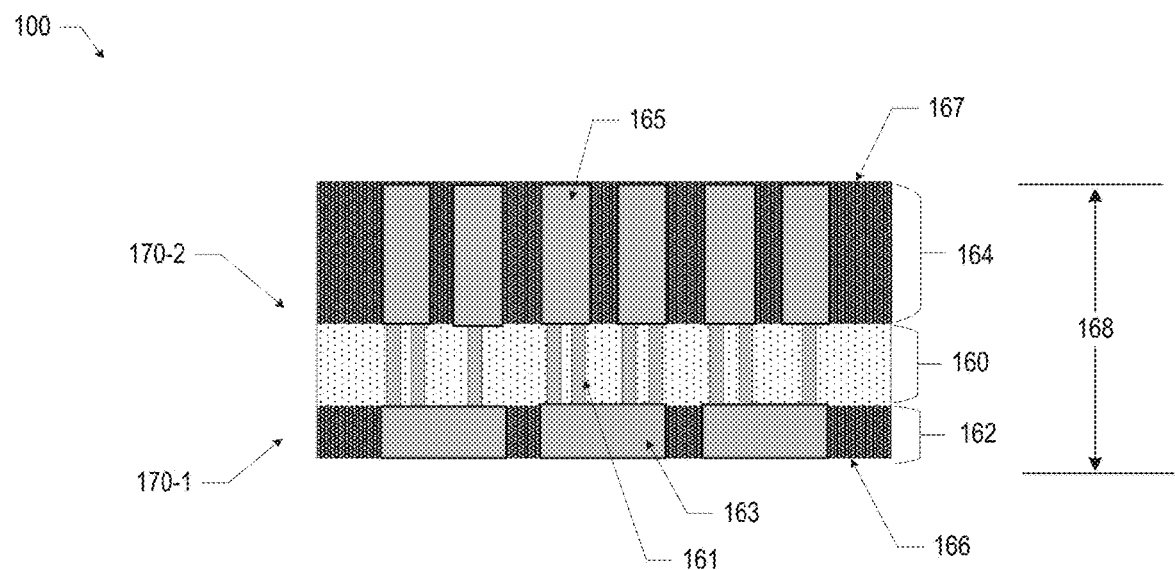
FIG. 1 is a side, cross-sectional view of an example microelectronic component, in accordance with various embodiments.

Microelectronic components, and related assemblies, devices and methods, are disclosed herein. For example, in some embodiments, a microelectronic component may include a substrate having a first face and an opposing second face, wherein the substrate includes a through-substrate via (TSV); a first mold material region at the first face, wherein the first mold material region includes a first through-mold via (TMV) conductively coupled to the TSV; and a second mold material region at the second face, wherein the second mold material region includes a second TMV conductively coupled to the TSV. In some embodiments, a microelectronic assembly may include a first substrate having a first surface and an opposing second surface, wherein the first substrate includes a first through-substrate via (TSV); a microelectronic component embedded in the first substrate, the microelectronic component including: a second substrate having a first face and an opposing second face, where the second substrate includes a second TSV, a first mold material region at the first face, where the first mold material region includes a first through-mold via (TMV) conductively coupled to the second TSV, and a second mold material region at the second face, where the second mold material region includes a second TMV conductively coupled to the second TSV, and where the first mold material region is at the first surface of the first substrate and the second mold material region is at the second surface of the first substrate; and a die electrically coupled, at the second surface of the first substrate, to the first TSV and to the second TMV.

The drive for miniaturization of IC devices has created a similar drive to provide dense interconnections between dies in a package assembly. For example, microelectronic components, such as interposers and bridges, are emerging to provide dense interconnect routing between dies or other electrical components. To increase the functionality of a package substrate, an interposer or a bridge may be embedded in the package substrate to route signals between one or more dies as in EMIB architectures. Scalable high aspect ratio components, that provide even more dense interconnections, using conventional manufacturing equipment may be desired. The processes disclosed herein may be used to apply existing semiconductor processing techniques to fabricate high aspect ratio components and integrate them into an IC package. This improvement in computing density may enable new form factors for wearable computing devices and system-in-package applications in which dimensions are constrained. Various ones of the embodiments disclosed herein may improve IC package performance with greater design flexibility, at a lower cost, and/or with a reduced size relative to conventional approaches while improving the ease of manufacturing relative to conventional approaches. The microelectronic assemblies disclosed herein may be particularly advantageous for small and low-profile applications in computers, tablets, industrial robots, and consumer electronics (e.g., wearable devices).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" means "electrically insulating," unless otherwise specified. Throughout the specification, and in the claims, the term "coupled" means a direct or indirect connection, such as a direct electrical, mechanical, or magnetic connection between the things that are connected or an indirect connection, through one or more passive or active intermediary devices. The meaning of "a," "an," and "the" include plural references. The meaning of "in" includes "in" and "on."

When used to describe a range of dimensions, the phrase "between X and Y" represents a range that includes X and Y. For convenience, the phrase "FIG. 5" may be used to refer to the collection of drawings of FIGS. 5A-5I, the phrase "FIG. 6" may be used to refer to the collection of drawings of FIGS. 6A-6I, etc. Although certain elements may be referred to in the singular herein, such elements may include multiple sub-elements. For example, "an insulating material" may include one or more insulating materials. As used herein, "a conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via). As used herein, the term "lower density" and "higher density" are relative terms indicating that the conductive pathways (e.g., including conductive interconnects, conductive lines, and conductive vias) in a lower density medium are larger and/or have a greater pitch than the conductive pathways in a higher density medium. As used herein, the term "TSV" is defined as "through-substrate via" and is distinguished from the common term "through-silicon via" in that the substrate may include a silicon material but is not required to include a silicon material, as described below with reference to FIG. 1.

FIG. 1 is a side, cross-sectional view of a microelectronic component 100, in accordance with various embodiments. The microelectronic component 100 may include a substrate 160 having a first mold material layer 162 at a first surface 170-1 and a second mold material layer 164 at an opposing second surface 170-2, wherein the substrate includes a plurality of through-substrate vias (TSVs) 161. The first mold material layer 162 may include a first mold material 166 and a plurality of first through-mold vias (TMVs) 163 conductively coupled to the plurality of TSVs 161, and the second mold material layer 164 may include a second mold material 167 and a plurality of second TMVs 165 conductively coupled to the plurality of TSVs 161. In some embodiments, an individual first TMV 163 may be conductively coupled to an individual TSV 161. In some embodiments, an individual first TMV 163 may be conductively coupled to two or more TSVs 161. In some embodiments, an individual second TMV 165 may be conductively coupled to an individual TSV 161. In some embodiments, an individual second TMV 165 may be conductively coupled to two or more TSVs 161. As used herein, the terms "electrically coupled" and "conductively coupled" may be used interchangeably. As used herein, "mold material layer," "mold material region," "mold layer," and "mold region" may be used interchangeably.

The substrate 160 may be formed of any suitable insulating material (e.g., a dielectric material formed in multiple layers, as known in the art). The insulating material of the substrate 160 may include a dielectric material, such as silicon dioxide, silicon nitride, oxynitride, polyimide materials, glass reinforced epoxy matrix materials, or a low-k or ultra-low-k dielectric (e.g., carbon-doped dielectrics, fluorine-doped dielectrics, porous dielectrics, organic polymeric dielectrics, photo-imageable dielectrics, and/or benzocyclobutene-based polymers). In some embodiments, the insulating material may include a semiconductor material, such as silicon, germanium, or a III-V material (e.g., gallium nitride), and one or more additional materials. For example, an insulating material may include silicon oxide or silicon nitride. In some embodiments, the substrate 160 may be a die or a wafer, such as an active wafer or a passive wafer. In some embodiments, the substrate may include additional conductive components, such as signal traces, resistors, capacitors, or inductors. The TSVs 161 may be formed of any appropriate conductive material, such as copper, silver, nickel, gold, aluminum, or other metals or alloys, for example. In some embodiments, the substrate 160 may have a thickness (i.e., z-height) between 30 microns and 55 microns.

The first mold material 166 and the second mold material 167 may be any suitable insulating material that provides mechanical support to the microelectronic component 100. The first and second mold materials 166, 167 may reduce the likelihood of damage to the plurality of first and second TMVs 163, 165, respectively, which may increase functionality and manufacturing yields (i.e., decrease the number of rejects).The first mold material 166 may have same a thickness (i.e., z-height) as the first TMVs 163. In some embodiments, the first mold material 166 may have a thickness between 15 microns and 40 microns. The second mold material 167 may have same a thickness (i.e., z-height) as the second TMVs 165. In some embodiments, the second mold material 167 may have a thickness between 15 microns and 40 microns. In some embodiments, the microelectronic component 100 may have an overall thickness 168 between 60 microns and 135 microns and a high aspect ratio (width:length) between 1:10 and 1:20 (e.g., approximately 1:15), and the mold material may be selected to provide the microelectronic component 100 a rigid structure having low warpage.

In some embodiments, the mold material is an organic polymer with inorganic silica particles. In some embodiments, the mold material is an organic dielectric material, a fire retardant grade 4 material (FR-4), bismaleimide triazine (BT) resin, polyimide materials, glass reinforced epoxy matrix materials, or low-k and ultra-low-k dielectric (e.g., carbon-doped dielectrics, fluorine-doped dielectrics, porous dielectrics, and organic polymeric dielectrics). In some embodiments, the first mold material 166 and the second mold material 167 are a same mold material. In some embodiments, the first mold material 166 and the second mold material 167 are a different mold material.

The TMVs 163, 165 may be formed of any appropriate conductive material, such as copper, silver, nickel, gold, aluminum, or other metals or alloys, for example. The TMVs 163, 165 may be formed using any suitable process, including, for example, the process described with reference to FIG. 5. The TMVs 163, 165 may have any suitable size and shape. In some embodiments, the TMVs 163, 165 may have a circular, rectangular, or other shaped cross-section. In some embodiments, the first TMVs 163 may have a thickness (e.g., z-height) between 15 microns and 40 microns, and an individual first TMV 163 may have a cross-section between 30 and 70 microns. In some embodiments, the first TMVs 163 may have a thickness between 15 microns and 25 microns. In some embodiments, the first TMVs 163 may have a pitch between 90 microns and 300 microns. As used herein, pitch is measured center-to-center between adjacent TMVs (e.g., from a center of a first TMV to a center of an adjacent first TMV). In some embodiments, the second TMVs 165 may have a thickness (e.g., z-height) between 15 microns and 40 microns, and an individual second TMVs 165 may have a cross-section between 5 microns and 40 microns. In some embodiments, the second TMVs 165 may have a thickness between 20 microns and 30 microns. In some embodiments, the second TMVs 165 may have a pitch between 20 microns and 100 microns. In some embodiments, a pitch of the first TMVs may be the same as a pitch of the second TMVs. In some embodiments, a pitch of the first TMVs may be different than a pitch of the second TMVs.

The microelectronic component 100 may have an overall thickness 168 (i.e., z-height) between 60 microns and 100 microns. In some embodiments, the first mold material layer 162 may have a thickness between 10 microns and 40 microns. In some embodiments, the first mold material layer 162 may have a thickness between 10 microns and 20 microns. In some embodiments, the second mold material layer 164 may have a thickness between 15 microns and 50 microns. In some embodiments, the second mold material layer 164 may have a thickness between 20 microns and 30 microns.

Although FIG. 1 shows a particular arrangement of a microelectronic component 100 having a particular number of TSVs in the substrate 160, a particular number of first TMVs 163, a particular number of second TMVs 165, and a particular arrangement of the TMVs 163, 165 electrically coupled to the TSVs 161, a microelectronic component 100 may include any number and arrangement of TSVs 161 and TMVs 163, 165.

Figure 2:
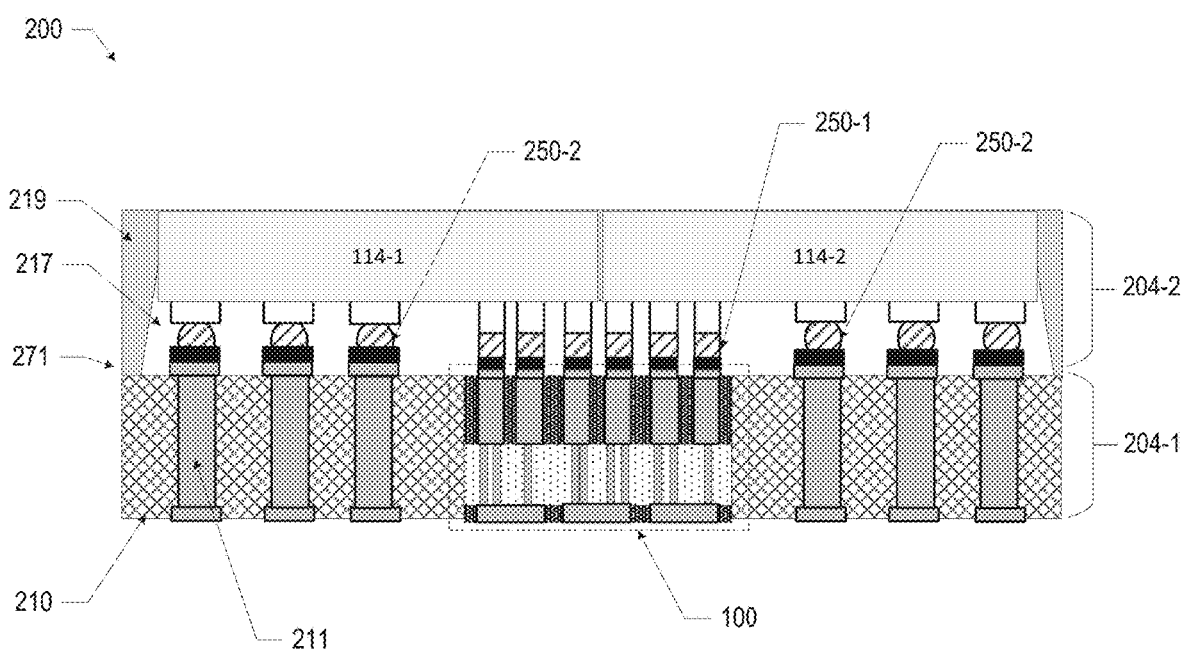
FIG. 2 is a side, cross-sectional view of an example microelectronic assembly including the microelectronic component of FIG. 1, in accordance with various embodiments.

FIG. 2 is a side, cross-sectional view of a multi-layer die subassembly 200, in accordance with various embodiments. As used herein, the terms a "multi-layer die subassembly" and a "composite die" may be used interchangeably. The multi-layer die subassembly 200 may include a first layer 204-1 having a substrate 210 with a plurality of TSVs 211 and an embedded microelectronic component 100, and a second layer 204-2 having a first die 114-1 and a second die 114-2 electrically coupled to the plurality of TSVs 211 and to the microelectronic component 100. As used herein, the term a "multi-layer die subassembly" 200 may refer to a composite die including two layers; a first layer 204-1 having a substrate with a plurality of TSVs and an embedded microelectronic component 100, and a second layer 204-2 having one or more dies 114 electrically coupled to the plurality of TSVs 211 and to the plurality of second TMVs 165 of the embedded microelectronic component 100. As described with reference to FIG. 1, the first and second TMVs 163, 165 may have different pitches such that a die 114 of the multi-layer die subassembly 200 also may have contacts with different pitches (e.g., "coarser" conductive contacts for coupling to the TSVs 211 and "finer" conductive contacts for coupling to the second TMVs 165). The die 114 of the multi-layer die subassembly 200 may be a single-sided die (in the sense that the die 114 only has conductive contacts on a single surface), and may be a mixed-pitch die (in the sense that the die 114 has sets of conductive contacts with different pitch).

The substrate 210 may be formed of any suitable insulating material (e.g., a dielectric material formed in multiple layers, as known in the art). The insulating material of the substrate 210 may include a dielectric material, such as silicon dioxide, silicon nitride, oxynitride, polyimide materials, glass reinforced epoxy matrix materials, or a low-k or ultra-low-k dielectric (e.g., carbon-doped dielectrics, fluorine-doped dielectrics, porous dielectrics, organic polymeric dielectrics, photo-imageable dielectrics, and/or benzocyclobutene-based polymers). In some embodiments, the insulating material of a die 114 may include a semiconductor material, such as silicon, germanium, or a III-V material (e.g., gallium nitride), and one or more additional materials. For example, an insulating material may include silicon oxide or silicon nitride. The plurality of TSVs 211 may be formed of any appropriate conductive material, such as copper, silver, nickel, gold, aluminum, or other metals or alloys, for example. The plurality of TSVs 211 may be isolated from the surrounding insulating material by a barrier oxide. Power, ground, and/or signals may be transmitted to and from the dies 114-1, 114-2 via the TSVs 211 and via other conductive pathways.

The die 114 disclosed herein may include an insulating material (e.g., a dielectric material formed in multiple layers, as known in the art) and multiple conductive pathways formed through the insulating material. In some embodiments, the insulating material of a die 114 may include a dielectric material, such as silicon dioxide, silicon nitride, oxynitride, polyimide materials, glass reinforced epoxy matrix materials, or a low-k or ultra-low-k dielectric (e.g., carbon-doped dielectrics, fluorine-doped dielectrics, porous dielectrics, organic polymeric dielectrics, photo-imageable dielectrics, and/or benzocyclobutene-based polymers). In some embodiments, the insulating material of a die 114 may include a semiconductor material, such as silicon, germanium, or a III-V material (e.g., gallium nitride), and one or more additional materials. For example, an insulating material may include silicon oxide or silicon nitride. The conductive pathways in a die 114 may include conductive traces and/or conductive vias, and may connect any of the conductive contacts in the die 114 in any suitable manner (e.g., connecting multiple conductive contacts on a same surface or on different surfaces of the die 114). Example structures that may be included in the dies 114 disclosed herein are discussed below with reference to FIG. 9. The conductive pathways in the dies 114 may be bordered by liner materials, such as adhesion liners and/or barrier liners, as suitable. In some embodiments, the die 114 is a wafer. In some embodiments, the die 114 is a monolithic silicon, a fan-out or fan-in package die, or a die stack (e.g., wafer stacked, die stacked, or multi-layer die stacked).

The dies 114-1, 114-2 may be coupled to the microelectronic component 100 and to the TSVs 211 in the substrate 210 via first level interconnects (FLIs) 250, as depicted in FIG. 2 as FLIs 250-1 and 250-2, respectively. The FLIs 250 disclosed herein may take any suitable form. In some embodiments, the FLIs 250 may include solder (e.g., solder bumps or balls that are subject to a thermal reflow to form the interconnects). In some embodiments, the FLIs 250 may include an anisotropic conductive material, such as an anisotropic conductive film or an anisotropic conductive paste. An anisotropic conductive material may include conductive materials dispersed in a non-conductive material. In some embodiments, the FLIs 250-1 (i.e., the FLIs between the dies 114 and the microelectronic component 100) have a pitch between 15 microns and 100 microns (e.g., between 20 microns and 30 microns). In some embodiments, the FLIs 250-2 (i.e., the FLIs between the dies 114 and the TSVs 211 in the substrate 210) have a pitch between 80 microns and 500 microns (e.g., between 80 microns and 120 microns).

The multi-layer die subassembly 200 of FIG. 2 may also include an underfill material 217. In some embodiments, the underfill material 217 may extend between the dies 114-1, 114-2 and the substrate 210 around the associated FLIs 250. The underfill material 217 may be an insulating material, such as an appropriate epoxy material. In some embodiments, the underfill material 217 may include a capillary underfill, non-conductive film (NCF), or molded underfill. In some embodiments, the underfill material 217 may include an epoxy flux that assists with soldering the dies 114-1, 114-2 to the substrate 210 when forming the FLIs 250, and then polymerizes and encapsulates the FLIs 250. The underfill material 217 may be selected to have a coefficient of thermal expansion (CTE) that may mitigate or minimize the stress between the dies 114-1, 114-2 and the substrate 210 arising from uneven thermal expansion in the multi-layer die subassembly 200. In some embodiments, the CTE of the underfill material 217 may have a value that is intermediate to the CTE of the substrate 210 (e.g., the CTE of the dielectric material of the substrate 210) and a CTE of the dies 114-1, 114-2.

The multi-layer die subassembly 200 of FIG. 2 may also include an overmold material 219. In some embodiments, the overmold material 219 may be disposed around the dies 114-1, 114-2 and in contact with the surface 271 of the substrate 210. The overmold material 219 may be an insulating material, such as an appropriate epoxy material.

Figure 3:
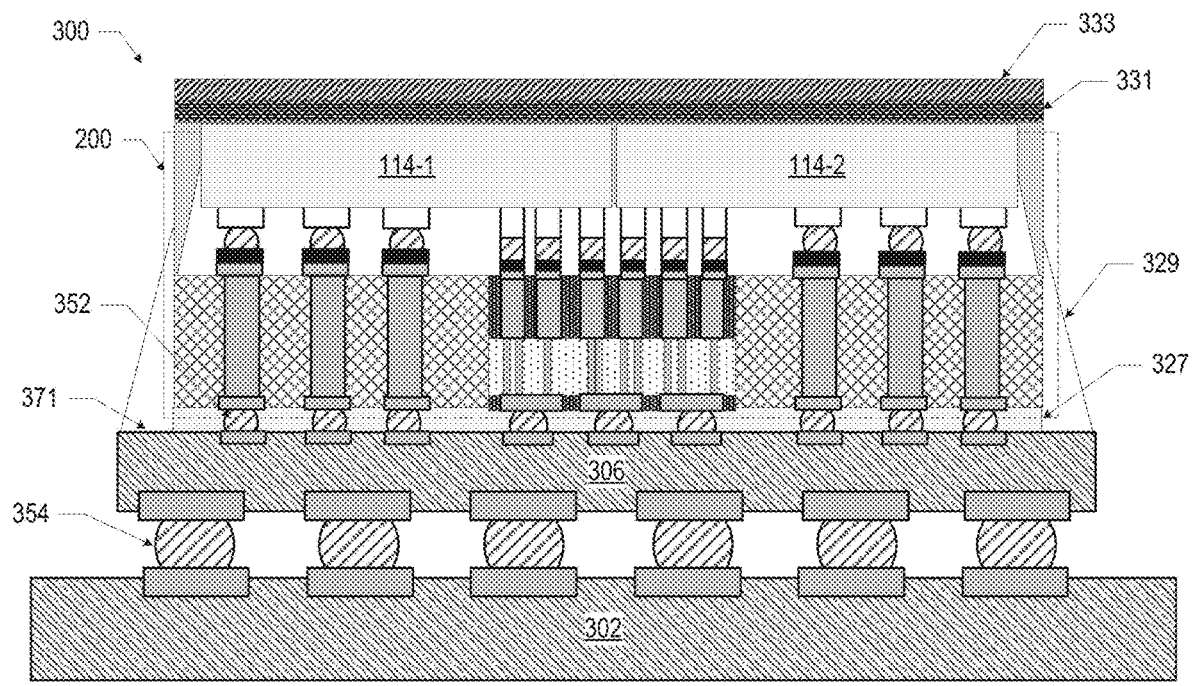
FIG. 3 is a side, cross-sectional view of an example microelectronic assembly including the microelectronic component of FIG. 1, in accordance with various embodiments.

FIG. 3 is a side, cross-sectional view of a microelectronic assembly 300, in accordance with various embodiments. The microelectronic assembly 300 of FIG. 3 may include the multi-layer die subassembly 200, a package substrate 306, and an interposer 302. The multi-layer die subassembly 200 may be coupled to the package substrate 306 via mid-level interconnects (MLIs) 352, and the interposer 302 may be coupled to the package substrate 306 via second level interconnects (SLIs) 354. The MLIs 352 and SLIs 354 disclosed herein may take any suitable form. In some embodiments, the MLIs 352 and SLIs 354 may include solder (e.g., solder bumps or balls that are subject to a thermal reflow to form the interconnects). In some embodiments, the MLIs 352 and SLIs 354 may include solder balls for a ball grid array arrangement, pins in a pin grid array arrangement or lands in a land grid array arrangement. In some embodiments, the interposer 302 may be a circuit board. The circuit board may be a motherboard, for example, and may have other components attached to it. The circuit board may include conductive pathways and other conductive contacts for routing power, ground, and signals through the circuit board, as known in the art. In some embodiments, the SLIs 354 may couple the package substrate 306 to another IC package, or any other suitable component. In some embodiments, the multi-layer die subassembly 200 may not be coupled to a package substrate 306, but may instead be coupled to a circuit board, such as a PCB.

The package substrate 306 may include an insulating material (e.g., a dielectric material formed in multiple layers, as known in the art) and one or more conductive pathways to route power, ground, and signals through the dielectric material (e.g., including conductive traces and/or conductive vias, as shown). In some embodiments, the insulating material of the package substrate 306 may be a dielectric material, such as an organic dielectric material, a fire retardant grade 4 material (FR-4), BT resin, polyimide materials, glass reinforced epoxy matrix materials, organic dielectrics with inorganic fillers or low-k and ultra-low-k dielectric (e.g., carbon-doped dielectrics, fluorine-doped dielectrics, porous dielectrics, and organic polymeric dielectrics). In particular, when the package substrate 306 is formed using standard printed circuit board (PCB) processes, the package substrate 306 may include FR-4, and the conductive pathways in the package substrate 306 may be formed by patterned sheets of copper separated by build-up layers of the FR-4. The conductive pathways in the package substrate 306 may be bordered by liner materials, such as adhesion liners and/or barrier liners, as suitable.

In some embodiments, the package substrate 306 may be formed using a lithographically defined via packaging process. In some embodiments, the package substrate 306 may be manufactured using standard organic package manufacturing processes, and thus the package substrate 306 may take the form of an organic package. In some embodiments, the package substrate 306 may be a set of redistribution layers formed on a panel carrier by laminating or spinning on a dielectric material, and creating conductive vias and lines by laser drilling and plating. In some embodiments, the package substrate 306 may be formed on a removable carrier using any suitable technique, such as a redistribution layer technique. Any method known in the art for fabrication of the package substrate 306 may be used, and for the sake of brevity, such methods will not be discussed in further detail herein.

The microelectronic assembly 300 of FIG. 3 may also include an underfill material 327. In some embodiments, the underfill material 327 may extend between the multi-layer die subassembly 200 and the package substrate 306 around the associated MLIs 352. The underfill material 327 may be an insulating material, such as an appropriate epoxy material. In some embodiments, the underfill material 327 may include a capillary underfill, non-conductive film (NCF), or molded underfill. In some embodiments, the underfill material 327 may include an epoxy flux that assists with soldering the multi-layer die subassembly 200 to the package substrate 306 when forming the MLIs 352, and then polymerizes and encapsulates the MLIs 352. The underfill material 327 may be selected to have a coefficient of thermal expansion (CTE) that may mitigate or minimize the stress between the multi-layer die subassembly 200 and the package substrate 306 arising from uneven thermal expansion.

The microelectronic assembly 300 of FIG. 3 may also include an overmold material 329. In some embodiments, the overmold material 329 may be disposed around the multi-layer die subassembly 200 and in contact with the surface 371 of the package substrate 306. The overmold material may be an insulating material, such as an appropriate epoxy material.

The microelectronic assembly 300 of FIG. 3 may also include a heat spreader 333. The heat spreader 333 may be used to move heat away from the dies 114-1, 114-2 (e.g., so that the heat may be more readily dissipated by a heat sink or other thermal management device). The heat spreader 333 may include any suitable thermally conductive material (e.g., metal, appropriate ceramics, etc.), and may include any suitable features (e.g., fins). In some embodiments, the heat spreader 333 may be an integrated heat spreader.

The microelectronic assembly 300 of FIG. 3 may also include a highly thermally conductive mold material or a thermal interface material (TIM) 331. The TIM 331 may include a thermally conductive material (e.g., metal particles) in a polymer or other binder. The TIM 331 may be a thermal interface material paste or a thermally conductive epoxy (which may be a fluid when applied and may harden upon curing, as known in the art). The TIM 331 may provide a path for heat generated by the dies 114-1, 114-2 to readily flow to the heat spreader 333, where it may be spread and/or dissipated.

Figure 4:
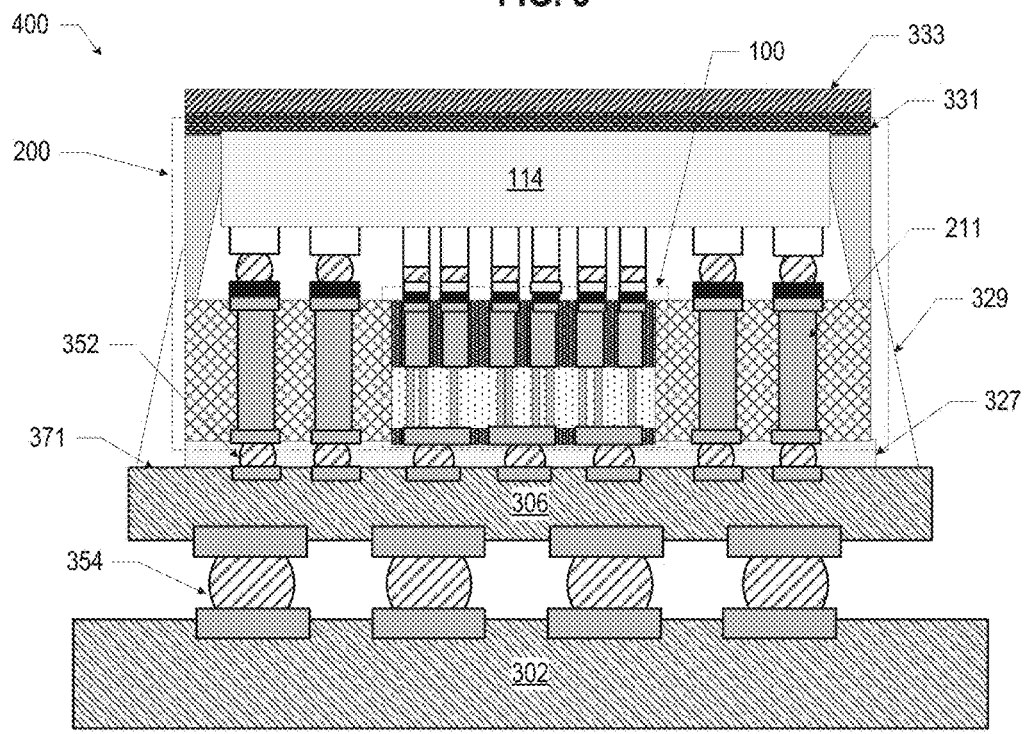
FIG. 4 is a side, cross-sectional view of another example microelectronic assembly including the microelectronic component of FIG. 1, in accordance with various embodiments.

FIG. 4 is a side, cross-sectional view of a microelectronic assembly 400, in accordance with various embodiments. The microelectronic assembly 400 of FIG. 4 is similar to the microelectronic assembly 300 of FIG. 3 and only differs in that the multi-layer die subassembly 200 includes a single die 114, not multiple dies, electrically coupled to the plurality of TSVs 211 and to the microelectronic component 100.

Figure 5A:
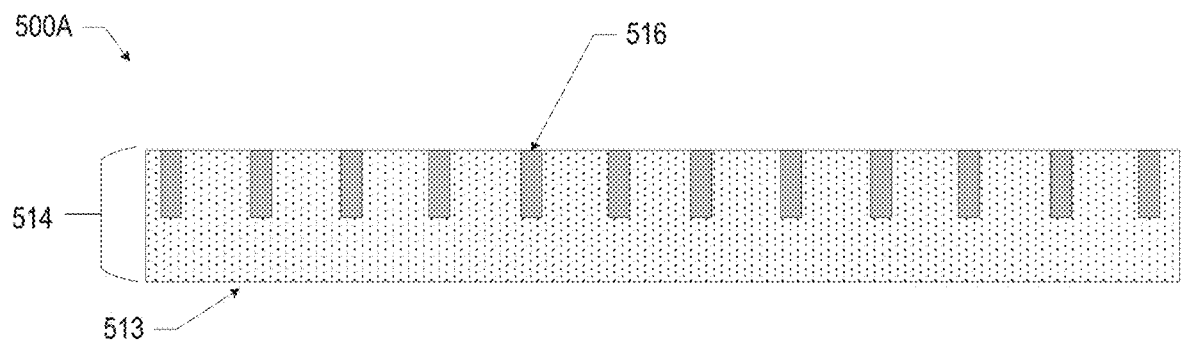
FIGS. 5A-5I are side, cross-sectional views of various stages in an example process for manufacturing the microelectronic component of FIG. 1, in accordance with various embodiments.

FIG. 5A illustrates an assembly 500A including a wafer 514 having a substrate 513 and a plurality of TSVs 516, where the top surface of the TSVs 516 is exposed. In some embodiments, the wafer 514 is an active wafer having an active layer (not shown) and a backside layer with TSVs, where non-electrical material is removed from the backside layer of the wafer to expose the top surface of the TSVs. The non-electrical material, which is an inactive portion of the wafer, may include silicon, ceramic, or quartz, among other materials. The non-electrical material may be removed using any suitable technique, including, for example, grinding, etching, such as reactive ion etching (RIE) or chemical etching. In some embodiments, the wafer 514 is a passive wafer. In some embodiments, the wafer 514 is disposed on a carrier (not shown) during manufacturing operations. The carrier may include any suitable material for providing mechanical stability during manufacturing operations. When using a carrier, the wafer 514 may be attached to the carrier using any suitable technique, including a temporary adhesive layer or a die attach film (DAF).

Figure 5B:
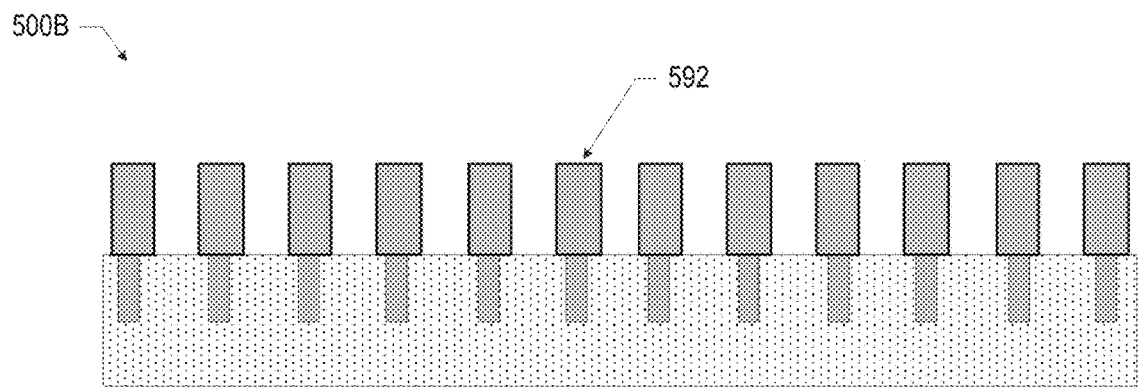

FIG. 5B illustrates an assembly 500B subsequent to forming conductive pillars 592 on the top surface of the TSVs 516. The conductive pillars 592 may take the form of any of the embodiments disclosed herein, and may be formed using any suitable technique, for example, a lithographic process or an additive process, such as cold spray or 3-dimensional printing. For example, the conductive pillars 592 may be formed by depositing, exposing, and developing a photoresist layer on the top surface of the TSVs 516. The photoresist layer may be patterned to form cavities in the shape of the conductive pillars. Conductive material, such as copper, may be deposited in the openings in the patterned photoresist layer to form the conductive pillars 592. The conductive material may be depositing using any suitable process, such as electroplating, sputtering, or electroless plating. The photoresist may be removed to expose the conductive pillars 592. In another example, a photo-imageable dielectric may be used to form the conductive pillars 592. In some embodiments, a seed layer (not shown) may be formed on the top surface of the TSVs prior to depositing the photoresist material and the conductive material. The seed layer may be any suitable conductive material, including copper. The seed layer may be removed, after removing the photoresist layer, using any suitable process, including chemical etching, among others. In some embodiments, the seed layer may be omitted.

Figure 5C:
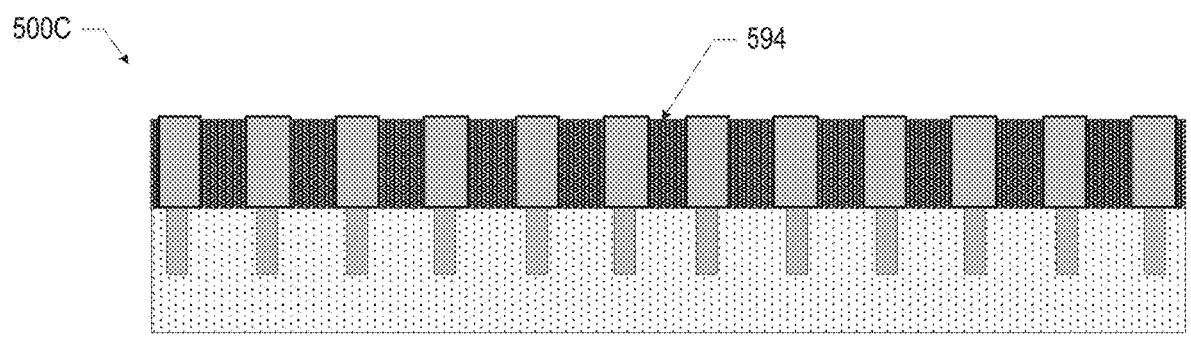

FIG. 5C illustrates an assembly 500C subsequent to providing a mold material 594 around the conductive pillars 592. The mold material 594 may be deposited using any suitable technique, such as compression molding, or lamination. In some embodiments, the mold material is cured subsequent to deposition. In some embodiments, the mold material 594 may be initially deposited on and over the tops of the conductive pillars 592, then, polished back and planarized to expose the top surfaces of the conductive pillars 592. The technique used to deposit the mold material may depend on the type of mold material used. The mold material may be removed using any suitable technique, including, for example, grinding, etching, such as reactive ion etching (RIE) or chemical etching. In some embodiments, the mold material used may depend on the desired characteristics for a microelectronic component (e.g., microelectronic component 100). The mold material 594 may be any suitable mold material, as described above with reference to FIG. 1. The conductive pillars 592 are similar to the second TMVs 165 of FIG. 1.

Figure 5D:
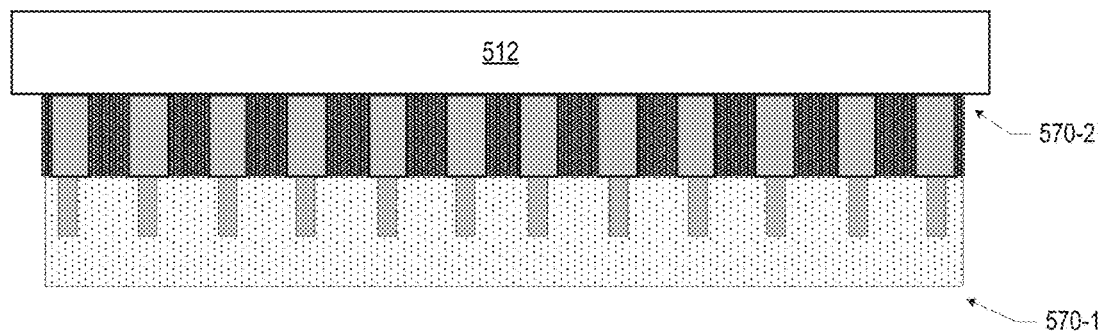

FIG. 5D illustrates an assembly 500D subsequent to depositing a carrier 512 on a top surface 570-2 of assembly 500C. The carrier may include any suitable material for providing mechanical stability during manufacturing operations. The assembly 500C may be attached to the carrier 512 using any suitable technique, including a temporary adhesive layer or a die attach film (DAF).

Figure 5E:
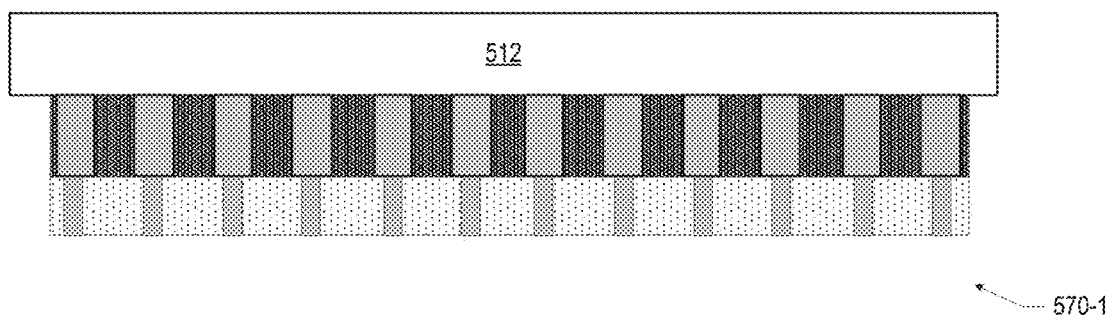

FIG. 5E illustrates an assembly 500E subsequent to removing non-electrical material from the bottom surface 570-1 of assembly 500D and planarizing to expose the bottom surface of the TSVs 516. The non-electrical material, which is an inactive portion of the wafer, may include silicon, ceramic, or quartz, among other materials. The non-electrical material may be removed using any suitable technique, including, for example, grinding, etching, such as reactive ion etching (RIE) or chemical etching.

Figure 5F:
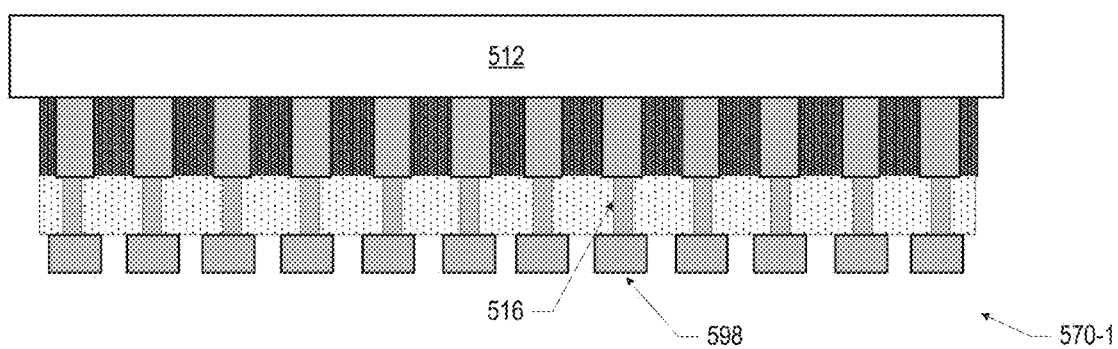

FIG. 5F illustrates an assembly 500F subsequent to forming conductive pillars 598 on the exposed bottom surface 570-1 of the TSVs 516. The conductive pillars 598 also may be referred to herein as conductive bumps or package-side bumps. The conductive pillars 598 may take the form of any of the embodiments disclosed herein, and may be formed using any suitable technique, for example, a lithographic process or an additive process, such as cold spray or 3-dimensional printing. In some embodiments, the conductive pillars 598 may be formed by depositing a silicon nitride passivation layer, opening the silicon nitride passivation layer to expose the surfaces of the TSVs 516 (i.e., at the bottom surface 570-1), deposit a conductive seed layer on the exposed surface of the TSVs, spin on a photoresist layer, develop the photoresist layer to create openings to form the conductive pillars 598, electroplate a conductive materials in the openings to form the conductive pillars 598, remove the photoresist layer, and, optionally, etch the seed layer, if appropriate. The conductive pillars 598 may be made of any suitable conductive material, and may have any suitable size and shape, as described above with reference to FIG. 1. The conductive pillars 598 are similar to the first TMVs 163 of FIG. 1.

Figure 5G:
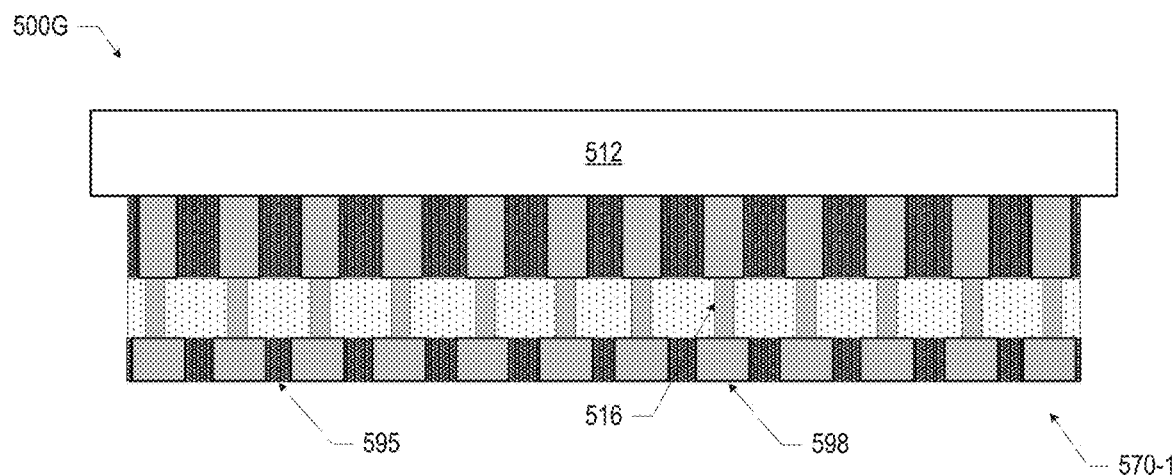

FIG. 5G illustrates an assembly 500G subsequent to providing a mold material 595 around the conductive pillars 598. The mold material 595 may be deposited using any suitable technique, such as compression molding, or lamination. In some embodiments, the mold material is cured subsequent to deposition. In some embodiments, the mold material 595 may be initially deposited on and over the conductive pillars 598, then, polished back and planarized to expose the bottom surfaces (i.e., at 570-1) of the conductive pillars 598. The technique used to deposit the mold material may depend on the type of mold material used. The mold material may be removed using any suitable technique, including, for example, grinding, etching, such as reactive ion etching (RIE) or chemical etching. In some embodiments, the mold material used may depend on the desired characteristics for a microelectronic component (e.g., microelectronic component 100). The mold material 595 may be any suitable mold material, as described above with reference to FIG. 1.

Figure 5H:
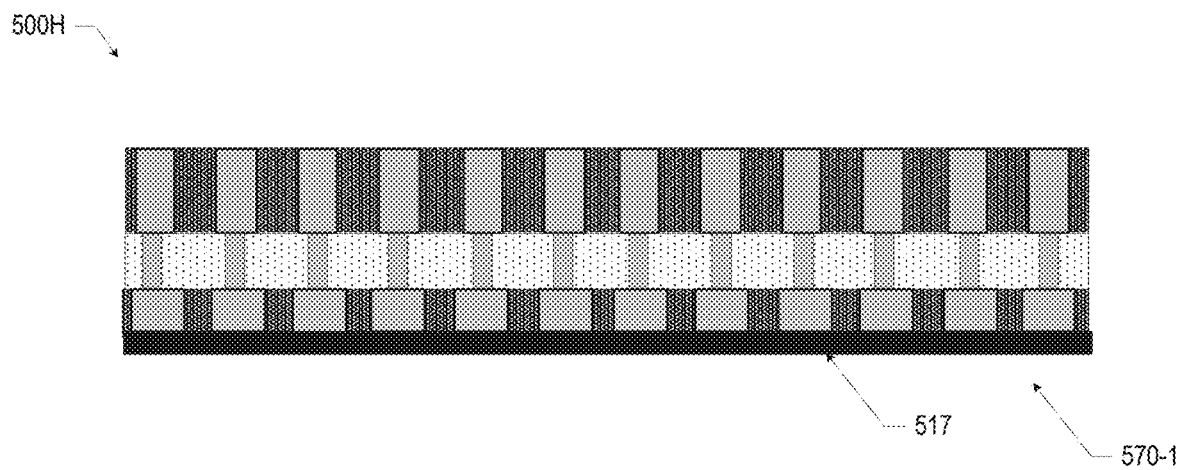

FIG. 5H illustrates an assembly 500H subsequent to removal of the carrier 512 and after attaching a bonding layer 517 on the bottom surface 570-1. The bonding layer 517 may be any suitable bonding layer, such as an adhesive layer or a die attach film (DAF), and may be attached using any suitable technique, including a temporary adhesive or lamination. In some embodiments, the bonding layer 517 has a thickness between 2 microns and 15 microns. In some embodiments, the bonding layer 517 has a thickness between 3 microns and 7 microns.

Figure 5I:
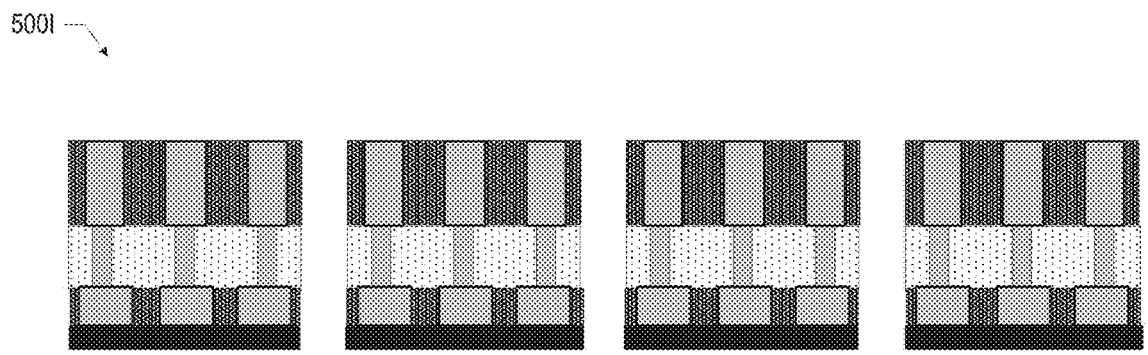

FIG. 5I illustrates an assembly 500I, also referred to herein as a microelectronic component, such as microelectronic component 100, subsequent to singulating into individual units. In some embodiments, the individual units may be the same. In some embodiments, the individual units may differ.

FIGS. 6A-6I are side, cross-sectional views of various stages in an example process for manufacturing the microelectronic assembly 300 of FIG. 3, in accordance with various embodiments. Any suitable techniques may be used to manufacture the microelectronic assemblies disclosed herein. Although the operations discussed below with reference to FIGS. 6A-6I (and others of the accompanying drawings representing manufacturing processes) are illustrated in a particular order, these operations may be performed in any suitable order. Additionally, although particular assemblies and particular multi-layer die subassemblies are illustrated in FIGS. 6A-6I (and others of the accompanying drawings representing manufacturing processes), the operations discussed below with reference to FIGS. 6A-6I may be used to form any suitable assemblies and subassemblies. In the embodiment of FIGS. 6A-6I, the microelectronic component (e.g., assembly 500I) may first be assembled into a composite die (e.g., assembly 600G), and then the composite die may be coupled to an interposer and/or a package substrate (e.g., assembly 600I). This approach may allow for tighter tolerances, and may be particularly desirable for integrating a microelectronic component (e.g., microelectronic component 100 of FIG. 1) for relatively small dies 114 into a composite die (e.g., subassembly 200 of FIG. 2).

Figure 6A:
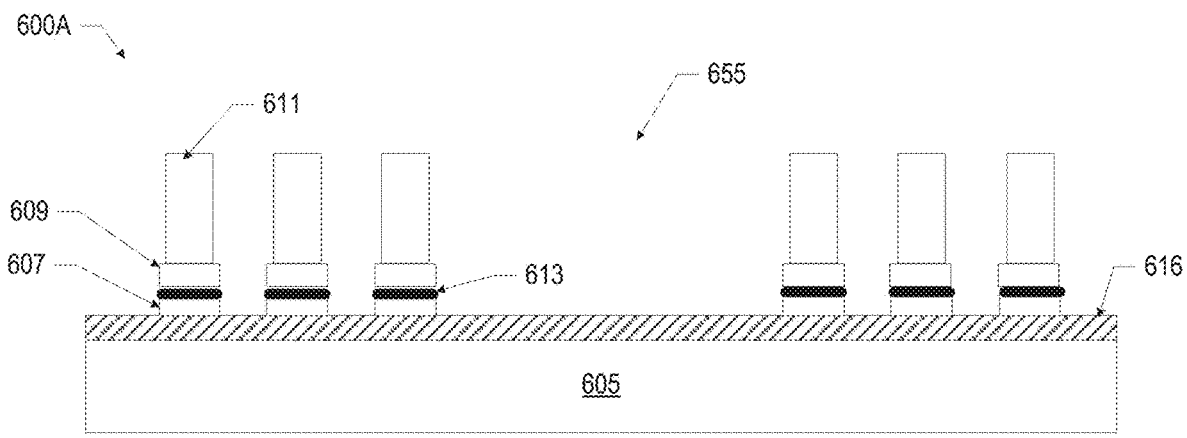
FIGS. 6A-6I are side, cross-sectional views of various stages in an example process for manufacturing the microelectronic assembly of FIG. 3, in accordance with various embodiments.

FIG. 6A illustrates an assembly 600A including a carrier 605 and, optionally, a bonding film 616 subsequent to forming first conductive pads 607, stop-etch layer 613, second conductive pads 609, and conductive TSVs 611 on the top surface of the bonding film 616. The carrier 605 may include any suitable material for providing mechanical stability during manufacturing operations, including, for example, a glass carrier. The bonding film 616 may be any suitable temporary bonding film, for example, a temporary adhesive layer or a DAF. The first conductive pads 607, the stop-etch layer 613, the second conductive pads 609, and the conductive TSVs 611 may be disposed to form one or more de-population regions 655 in which no conductive structures are present. As used herein, the terms "conductive pads," "conductive interconnects," and "conductive contacts" may be used interchangeably. The first conductive pads 607, the stop-etch layer 613, the second conductive pads 609, and the conductive TSVs 611 may be formed using any suitable technique, for example, a lithographic process or an additive process, such as cold spray or 3-dimensional printing. For example, the first conductive pads 607, the stop-etch layer 613, the second conductive pads 609, and the conductive TSVs 611 may be formed by depositing, exposing, and developing multiple photoresist layers, and depositing a conductive material, such as a metal, on the bonding film 616. The photoresist layers may be patterned to form cavities in the shape of the first conductive pads 607, the stop-etch layer 613, the second conductive pads 609, and the conductive TSVs 611. Conductive material, such as copper, may be deposited in the openings in the patterned photoresist layers to form the first conductive pads 607, the second conductive pads 609, and the conductive TSVs 611. A stop-etch material, such as nickel, may be deposited in the openings in the patterned photoresist layer to form the stop-etch layer 613. The conductive material and stop-etch material may be depositing using any suitable process, such as electroplating, sputtering, or electroless plating. In some embodiments, the photoresist may be removed after each material deposition to expose the first conductive pads 607, the stop-etch layer 613, the second conductive pads 609, and the conductive TSVs 611, respectively. In some embodiments, a first photoresist material may be deposited and developed to form the first conductive pads 607, the stop-etch layer 613, and the second conductive pads 609, then the first photoresist material may be removed, and a second photoresist material may be deposited and developed to form the conductive TSVs 611, then the second photoresist material may be removed. In another example, a photo-imageable dielectric may be used to form the first conductive pads 607, the stop-etch layer 613, the second conductive pads 609, and the conductive TSVs 611. In some embodiments, a seed layer (not shown) may be formed on the top surface of the bonding film 616 prior to depositing the photoresist material and the conductive material. The seed layer may be any suitable conductive material, including copper or titanium/copper. The seed layer may be removed, after removing the final photoresist layer, using any suitable process, including chemical etching, among others. In some embodiments, the seed layer may be omitted.

The first conductive pads 607 may have any suitable dimensions and may be made of any suitable conductive material, for example, the first conductive pads 607 may have a thickness between 2 microns and 10 microns and may be made of copper. The etch-stop layer 613 may have any suitable dimensions, for example, the etch-stop layer 613 may have a length and a width equal to the first conductive pads 607 and may have a thickness between 2 microns and 5 microns. The etch-stop layer may be made of any suitable material, such as nickel. The second conductive pads 609 may have any suitable dimensions and may be made of any suitable conductive material, for example, the second conductive pads 609 may have a length and a width equal to the first conductive pads 607 and may have a thickness between 10 microns and 20 microns.

The conductive TSVs 611 may have any suitable dimensions and may be made of any suitable conductive material, as described with reference to FIG. 2. In some embodiments, an individual conductive TSV 611 may have a diameter (e.g., cross-section) between 10 microns and 1000 microns. For example, an individual conductive TSV 611 may have a diameter between 50 microns and 400 microns. In some embodiments, an individual conductive TSV 611 may have a height (e.g., z-height or thickness) between 50 microns and 150 microns. The conductive pillars may have any suitable cross-sectional shape, for example, square, triangular, and oval, among others.

Figure 6B:
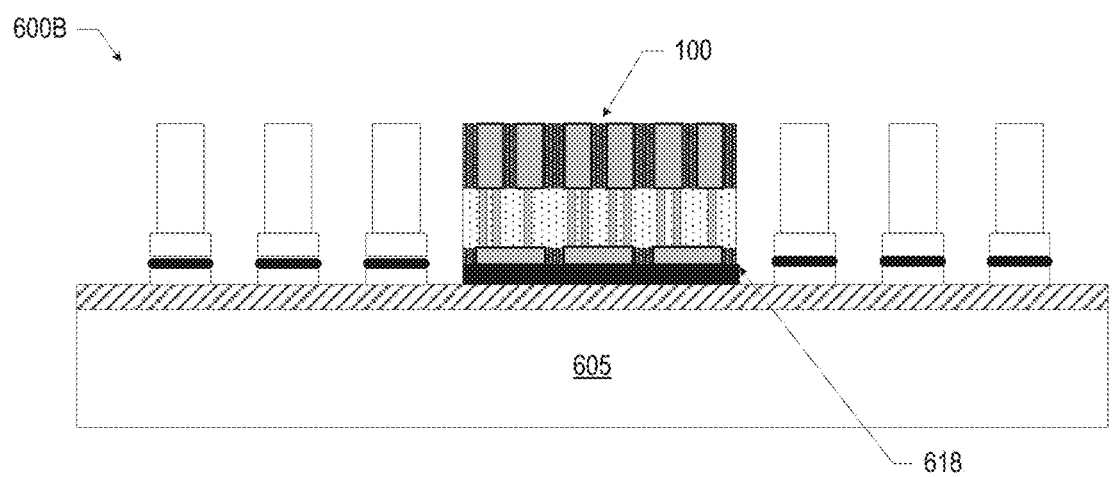

FIG. 6B illustrates an assembly 600B subsequent to placing a microelectronic component 100 in the de-population region 655 of the assembly 600A (FIG. 6A). The microelectronic component 100 may be the microelectronic component 100 of FIG. 1, or may be another similar component including a substrate with a first mold region at a first surface having first through-mold conductive structures and a second mold region at an opposing second surface having second through-mold conductive structures, where the substrate includes a plurality of through-silicon vias (TSVs), and where the first and second through-mold conductive structures are electrically coupled to the TSVs. The microelectronic component 100 may include an adhesive layer 618, or other similar layer such as a DAF, a die bonding film (DBF), or a release layer, for attaching to the de-population region 655 of assembly 600A. A release layer (also referred to herein as a debonding layer) may include a temporary adhesive, or other material that releases when exposed to heat or light, for example. The microelectronic component, such as the microelectronic component of FIGS. 1 and 5I, may be placed in the de-population region 655, using a same or similar technique to placing a die, such using as pick and place tooling.

Figure 6C:
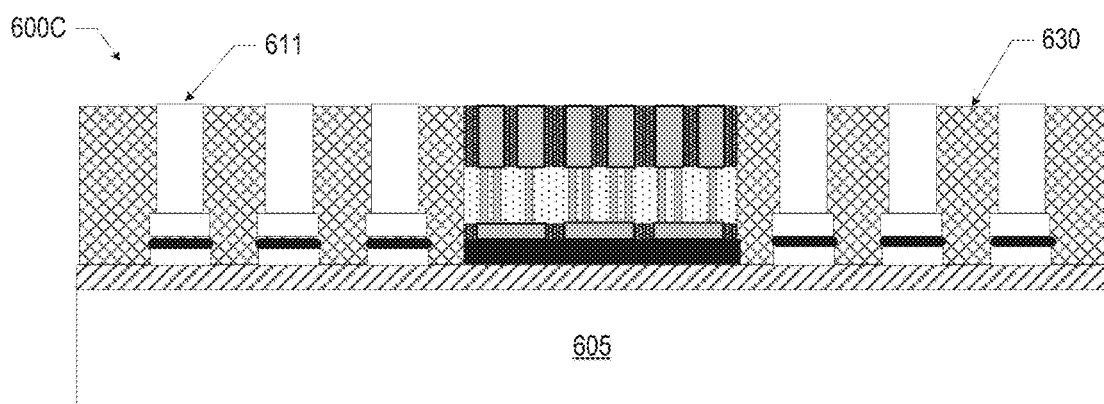

FIG. 6C illustrates an assembly 600C subsequent to providing an insulating material 630 around the microelectronic component 100, the first conductive pads 607, the stop-etch layer 613, the second conductive pads 609, and the conductive TSVs 611. The insulating material 630 may be deposited using any suitable technique, for example, by lamination. In some embodiments, the insulating material 630 may be initially deposited on and over the tops of the microelectronic component 100 and the conductive TSVs 611, then, polished back to expose the top surface of the microelectronic component 100 and the top surfaces of the conductive TSVs 611. In some embodiments, the insulating material 630 is a mold material, such as an organic polymer with inorganic silica particles. In some embodiments, the insulating material 630 is a dielectric material. In some embodiments, the dielectric material may include an organic dielectric material, a fire retardant grade 4 material (FR-4), BT resin, polyimide materials, glass reinforced epoxy matrix materials, or low-k and ultra-low-k dielectric (e.g., carbon-doped dielectrics, fluorine-doped dielectrics, porous dielectrics, and organic polymeric dielectrics). The dielectric material may be formed using any suitable process, including lamination, or slit coating and curing. If the dielectric layer is formed to completely cover the conductive TSVs 611 and the microelectronic component 100, the dielectric layer may be removed to expose the top surface of the microelectronic component 100 and the top surfaces of the conductive TSVs 611 using any suitable technique, including grinding, or etching, such as a wet etch, a dry etch (e.g., a plasma etch), a wet blast, or a laser ablation (e.g., using excimer laser). In some embodiments, the thickness of the insulating material 630 may be minimized to reduce the etching time required. In some embodiments, a redistribution layer (RDL) (not shown) may be formed on the top surface of the assembly 600C. The RDL may be manufactured using any suitable technique, such as a PCB technique or a redistribution layer technique.

Figure 6D:
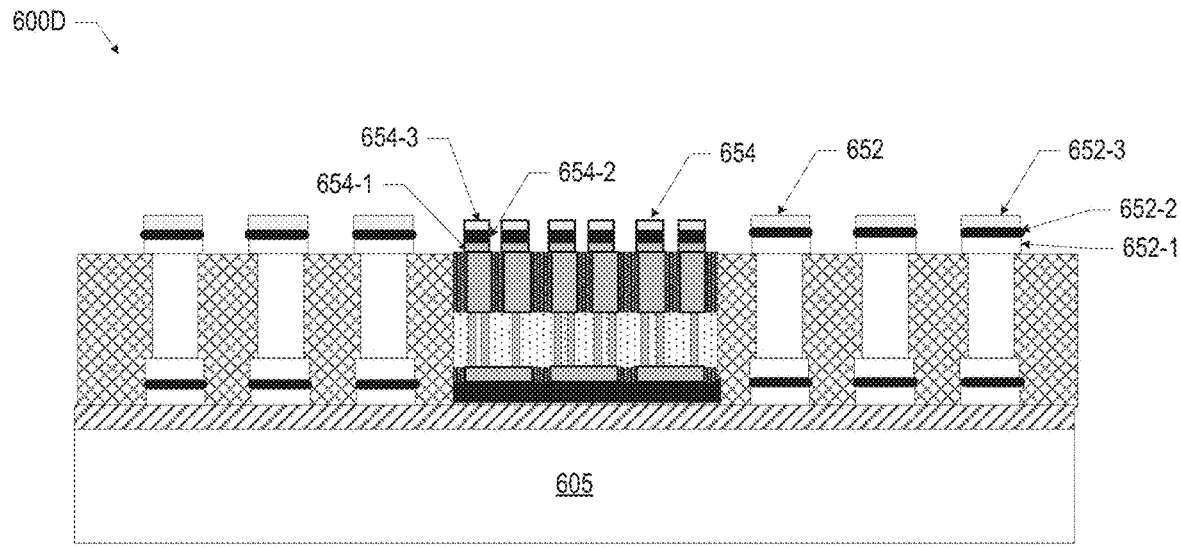

FIG. 6D illustrates an assembly 600D subsequent to forming conductive contacts 652 the top surfaces of the conductive TSVs 611 and forming conductive contacts 654 on the top surface of the microelectronic component 100. The conductive contacts 652, 654 may be formed using any suitable technique, including using lithography (with small vertical interconnect features formed by advanced laser or lithography processes). The conductive contacts 652, 654 may be made of any suitable conductive material, including copper. In some embodiments, the conductive contacts 652, 654 may have multiple metal layers and each metal layer may include a different metal material. For example, the conductive contacts 652, 654 may include three metal layers—a first metal layer including copper, a second metal layer including nickel, and a third metal layer including tin. The tin layer 652-3, 654-3 may be planarized using any suitable chemical or mechanical etch. In some embodiments, the second metal layer 652-2, 654-2 may be an etch-stop layer.

Figure 6E:
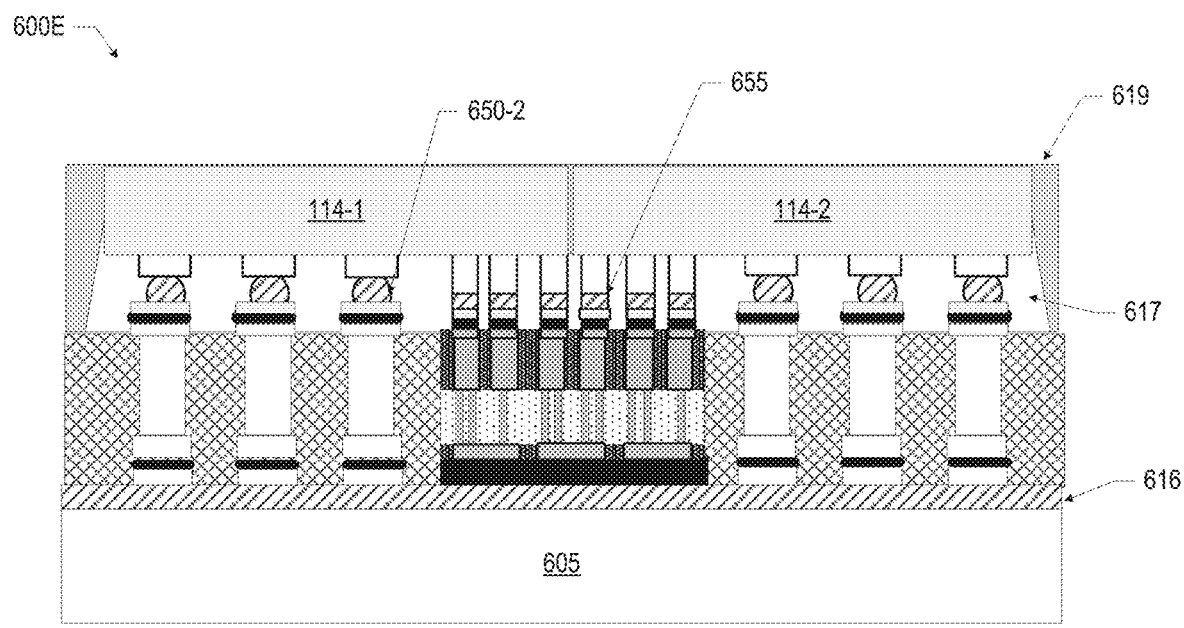

FIG. 6E illustrates an assembly 600E subsequent to placing the dies 114-1, 114-2, and providing an underfill material 617 around interconnects 650-1, 650-2, and an insulating material 619 around the dies. The dies 114-1, 114-2 may be electrically and mechanically coupled to the conductive TSVs by interconnects 650-2 and may be electrically and mechanically coupled to the microelectronic component 100 by interconnects 650-1. Interconnects 650-1, 650 may take any suitable form. In some embodiments, the interconnects 650-1, 650-may include solder (e.g., solder bumps or balls). The underfill material 617 and the insulating material 619, or overmold material, may be any suitable material and may be formed using any suitable technique, as described above with reference to FIG. 2.

Figure 6F:
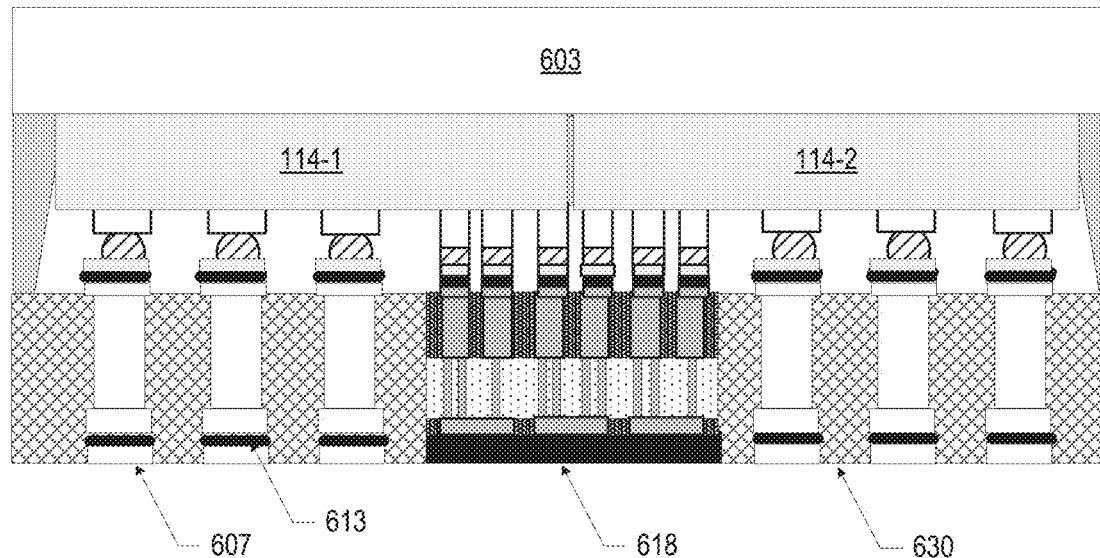

FIG. 6F illustrates an assembly 600F subsequent to removal of the carrier 605 and the bonding film 616 to expose the first conductive pads 607 and the adhesive layer 618, and subsequent to attachment of a carrier 603 at the top surface of assembly 600E. The carrier 603 may include any suitable material for providing mechanical stability during manufacturing operations, including, for example, a glass carrier. The carrier 603 may be attached using any suitable technique, for example, a temporary bonding film, an adhesive, or a DAF (not shown). In some embodiments, a heat spreader and/or a TIM (not shown) may be attached to the top surface of assembly 600E prior to attachment of carrier 603. The heat spreader and/or TIM may have any suitable form, as described with reference to FIG. 3.

Figure 6G:
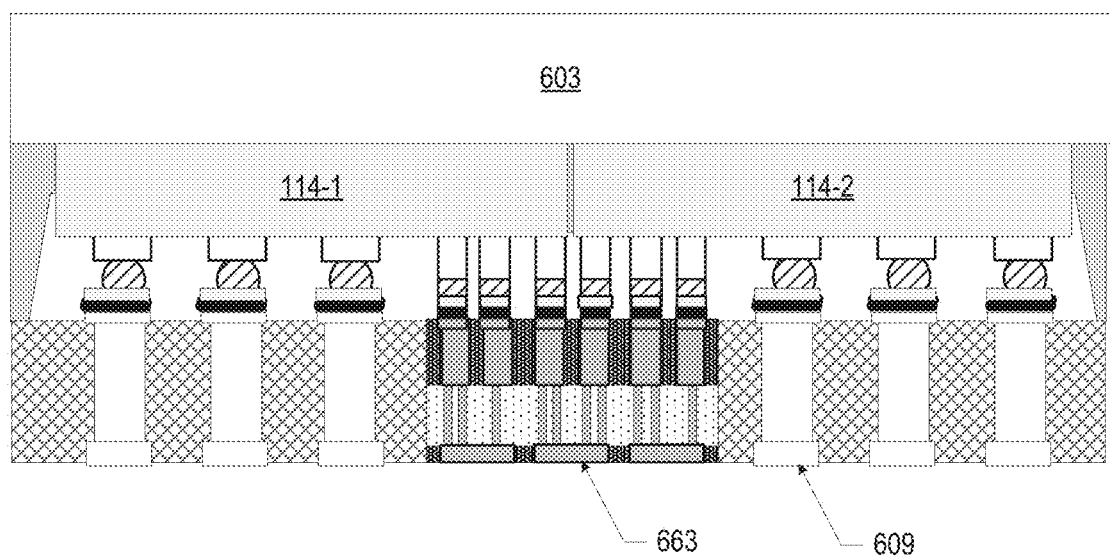

FIG. 6G illustrates an assembly 600G subsequent to removal of the first conductive pads 607, the etch-stop layer 613, the insulating material 630, and the adhesive layer 618 from the bottom of assembly 600F to expose the second conductive pads 609 and the TMVs 663 on the bottom surface (e.g., the first TMVs 163 in FIG. 1) of the microelectronic component 100. Each of the first conductive pads 607, the etch-stop layer 613, and the adhesive layer 618 may be removed using any suitable technique, including, for example, dry etch or mechanical grinding, among others.

Figure 6H:
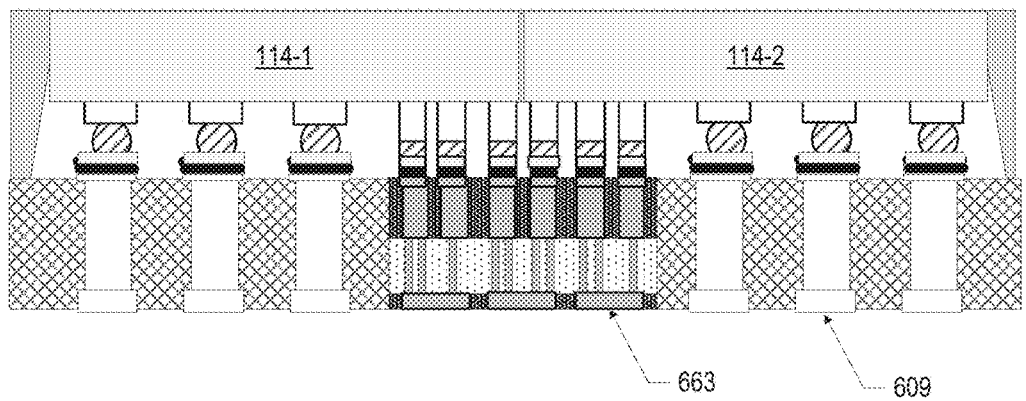

FIG. 6H illustrates an assembly 600H subsequent to removal of the carrier 603. The carrier 603 may be removed using any suitable process. If multiple composite dies (e.g., the multi-layer die subassembly 200 of FIG. 2) are manufactured together, the composite dies may be singulated after removal of the carrier 603. Further operations may be performed as suitable either before or after singulating (e.g., providing a TIM, attaching a heat spreader, depositing a solder resist layer, attaching solder balls for coupling to an interposer or a package substrate, etc.).

Figure 6I:
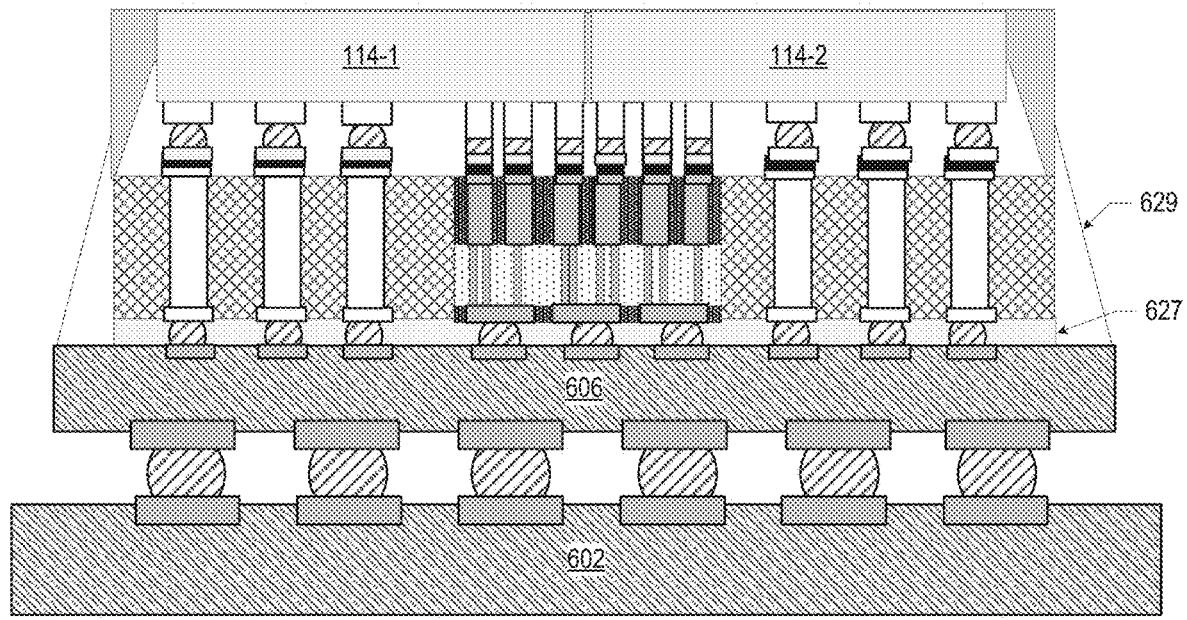

FIG. 6I illustrates an assembly 600I subsequent to coupling assembly 600H to a package substrate 606 and coupling the package substrate 606 to an interposer 602. The assembly 600H may be mechanically and electrically coupled to the package substrate 606, and the interposer 602 may be mechanically and electrically coupled to the package substrate 606 using any suitable interconnects, as described with reference to FIG. 3. In some embodiments, an underfill material 627 and an overmold material 629 may be provided as described with reference to FIG. 3.

Although the microelectronic components 100, the multi-layer die subassemblies 200, and the microelectronic assemblies 300, 400 disclosed herein show a particular number and arrangement of microelectronic components 100 and multi-layer die subassemblies 200 with a particular number of TSVs, dies, and interconnects, any number and arrangement of microelectronic components 100, multi-layer die subassemblies 200, TSVs, dies, and interconnects may be used.

The microelectronic components 100 and multi-layer die subassemblies 200 disclosed herein may be used for any suitable application. For example, in some embodiments, a multi-layer die subassembly 200 may be used to enable very small form factor voltage regulation for field programmable gate array (FPGA) or processing units (e.g., a central processing unit, a graphics processing unit, a FPGA, a modem, an applications processor, etc.) especially in mobile devices and small form factor devices. In another example, the die 114 in a multi-layer die subassembly 200 may be a processing device (e.g., a central processing unit, a graphics processing unit, a FPGA, a modem, an applications processor, etc.).

Figure 7:
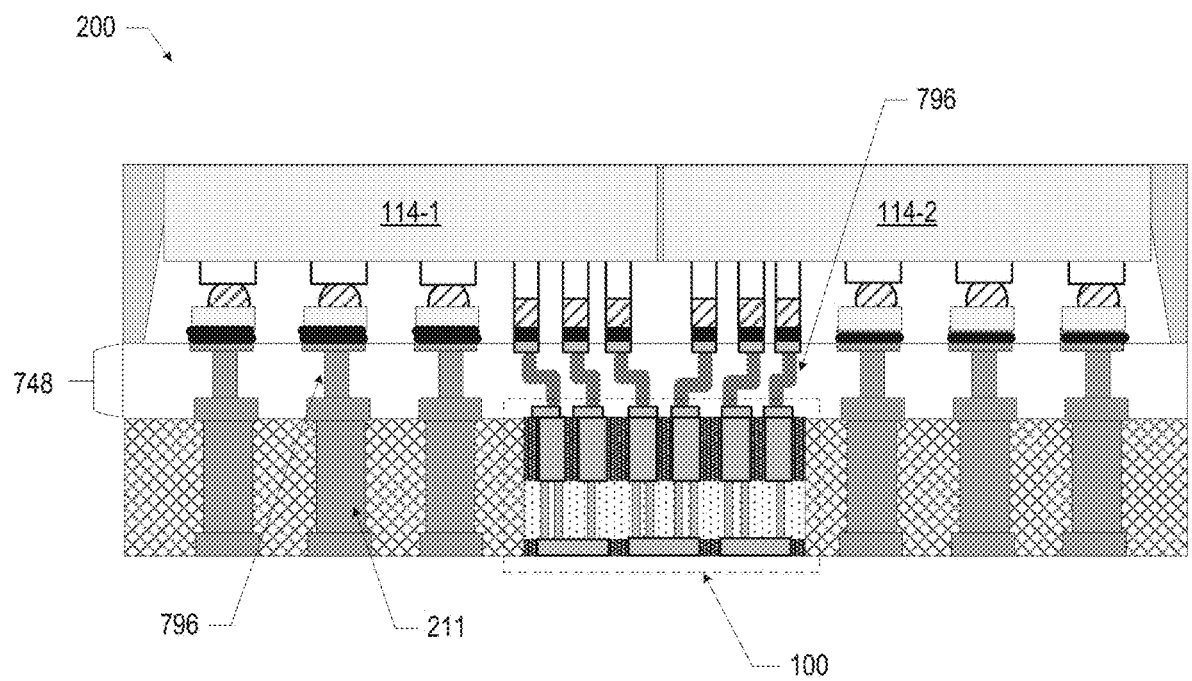
FIG. 7 is a side, cross-sectional view of another example microelectronic assembly including the microelectronic component of FIG. 1, in accordance with various embodiments.

FIG. 7 is a side, cross-sectional view of another example multi-layer die subassembly 200, in accordance with various embodiments. In the microelectronic assemblies 300, 400 disclosed herein, the multi-layer die subassembly 200 may include an RDL 748. For example, FIG. 7 illustrates an embodiment of a multi-layer die subassembly 200 having an RDL 748 below the dies 114-1, 114-2. The dies 114-1, 114-2 may be electrically coupled to the conductive TSVs 211 and to the microelectronic component 100 via conductive pathways 796 in the RDL 748. The RDL 748 may couple components having a less dense pitch to components having a denser pitch.

The microelectronic assemblies 300, 400 disclosed herein may be included in any suitable electronic component. FIGS. 8-11 illustrate various examples of apparatuses that may include, or be included in, any of the microelectronic assemblies 300, 400 disclosed herein.

Figure 8:
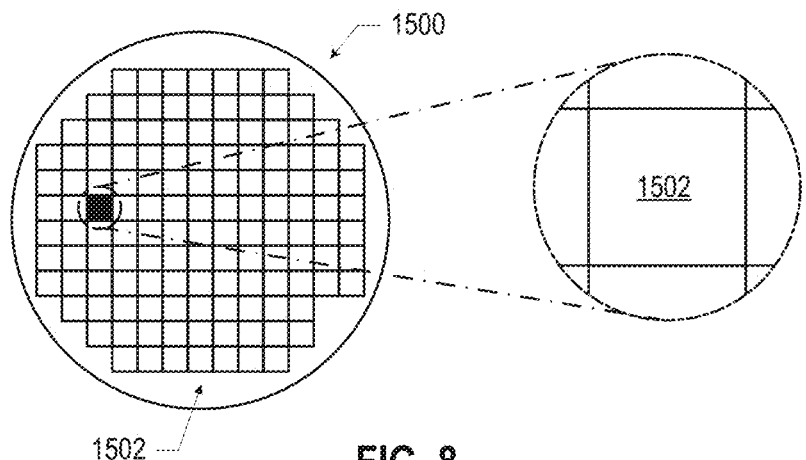
FIG. 8 is a top view of a wafer and dies that may be included in a microelectronic assembly, in accordance with any of the embodiments disclosed herein.

FIG. 8 is a top view of a wafer 1500 and dies 1502 that may be included in any of the microelectronic assemblies 300, 400 disclosed herein (e.g., as any suitable ones of the dies 114). The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may be any of the dies 114 disclosed herein. The die 1502 may include one or more transistors (e.g., some of the transistors 1640 of FIG. 9, discussed below), supporting circuitry to route electrical signals to the transistors, passive components (e.g., signal traces, resistors, capacitors, or inductors), and/or any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 11) or other logic that is configured to store information in the memory devices or execute instructions stored in the memory array. In some embodiments, a die 1502 (e.g., a die 114) may be a central processing unit, a radio frequency chip, a power converter, or a network processor. Various ones of the microelectronic assemblies 300, 400 disclosed herein may be manufactured using a die-to-wafer assembly technique in which some dies 114 are attached to a wafer 1500 that include others of the dies 114, and the wafer 1500 is subsequently singulated.

Figure 9:
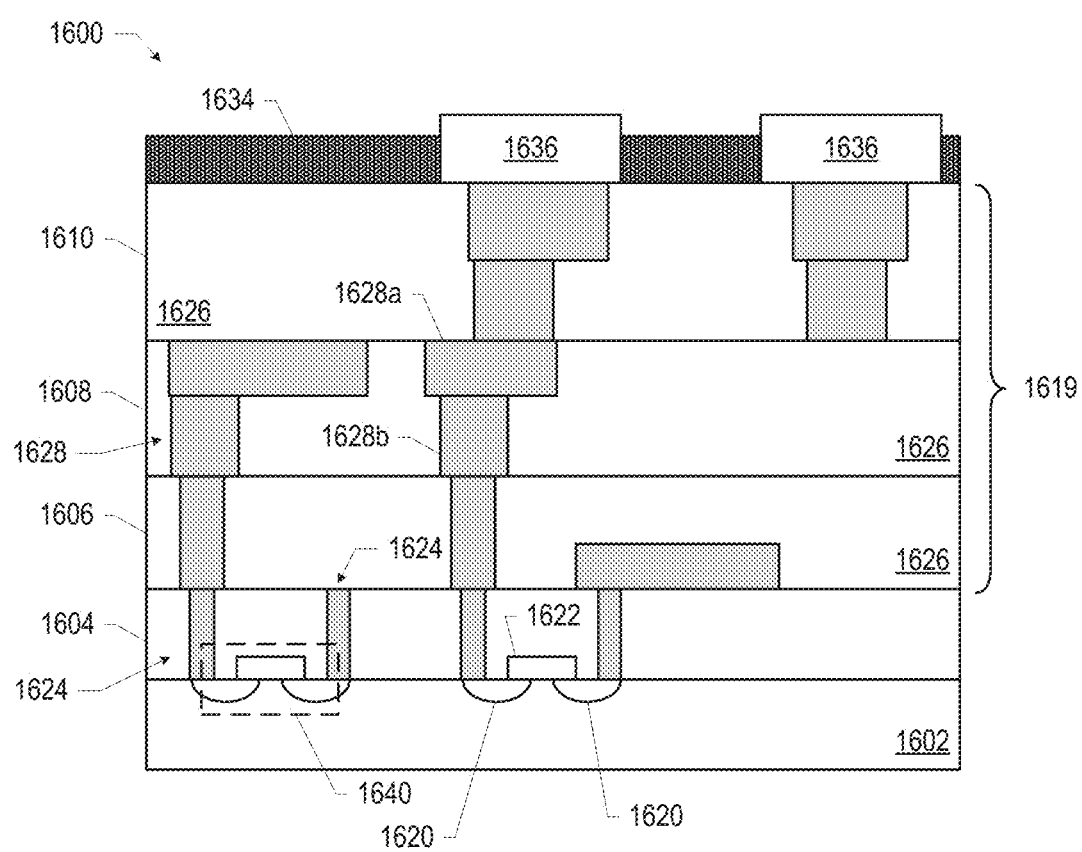
FIG. 9 is a cross-sectional side view of an IC device that may be included in a microelectronic assembly, in accordance with any of the embodiments disclosed herein.

FIG. 9 is a cross-sectional side view of an IC device 1600 that may be included in any of the microelectronic assemblies 300, 400 disclosed herein (e.g., in any of the dies 114). One or more of the IC devices 1600 may be included in one or more dies 1502 (FIG. 8). The IC device 1600 may be formed on a die substrate 1602 (e.g., the wafer 1500 of FIG. 8) and may be included in a die (e.g., the die 1502 of FIG. 8). The die substrate 1602 may be a semiconductor substrate composed of semiconductor material systems including, for example, n-type or p-type materials systems (or a combination of both). The die substrate 1602 may include, for example, a crystalline substrate formed using a bulk silicon or a silicon-on-insulator (SOI) substructure. In some embodiments, the die substrate 1602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1602. Although a few examples of materials from which the die substrate 1602 may be formed are described here, any material that may serve as a foundation for an IC device 1600 may be used. The die substrate 1602 may be part of a singulated die (e.g., the dies 1502 of FIG. 8) or a wafer (e.g., the wafer 1500 of FIG. 8).

The IC device 1600 may include one or more device layers 1604 disposed on the die substrate 1602. The device layer 1604 may include features of one or more transistors 1640 (e.g., metal oxide semiconductor field-effect transistors (MOSFETs)) formed on the die substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 9 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a PMOS or a NMOS transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the die substrate 1602 and two sidewall portions that are substantially perpendicular to the top surface of the die substrate 1602. In other embodiments, at least one of the metal layers that form the gate electrode may simply be a planar layer that is substantially parallel to the top surface of the die substrate 1602 and does not include sidewall portions substantially perpendicular to the top surface of the die substrate 1602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the die substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the die substrate 1602 to form the S/D regions 1620. An annealing process that activates the dopants and causes them to diffuse farther into the die substrate 1602 may follow the ion-implantation process. In the latter process, the die substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 9 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs; in particular, the arrangement is not limited to the particular configuration of interconnect structures 1628 depicted in FIG. 9. Although a particular number of interconnect layers 1606-1610 is depicted in FIG. 9, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the die substrate 1602 upon which the device layer 1604 is formed. For example, the lines 1628a may route electrical signals in a direction in and out of the page from the perspective of FIG. 9. The vias 1628b may be arranged to route electrical signals in a direction of a plane that is substantially perpendicular to the surface of the die substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 9. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 9, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

In some embodiments in which the IC device 1600 is a double-sided die, the IC device 1600 may include another metallization stack (not shown) on the opposite side of the device layer(s) 1604. This metallization stack may include multiple interconnect layers as discussed above with reference to the interconnect layers 1606-1610, to provide conductive pathways (e.g., including conductive lines and vias) between the device layer(s) 1604 and additional conductive contacts (not shown) on the opposite side of the IC device 1600 from the conductive contacts 1636.

In other embodiments in which the IC device 1600 is a double-sided die, the IC device 1600 may include one or more TSVs through the die substrate 1602; these TSVs may make contact with the device layer(s) 1604, and may provide conductive pathways between the device layer(s) 1604 and additional conductive contacts (not shown) on the opposite side of the IC device 1600 from the conductive contacts 1636.

Figure 10:
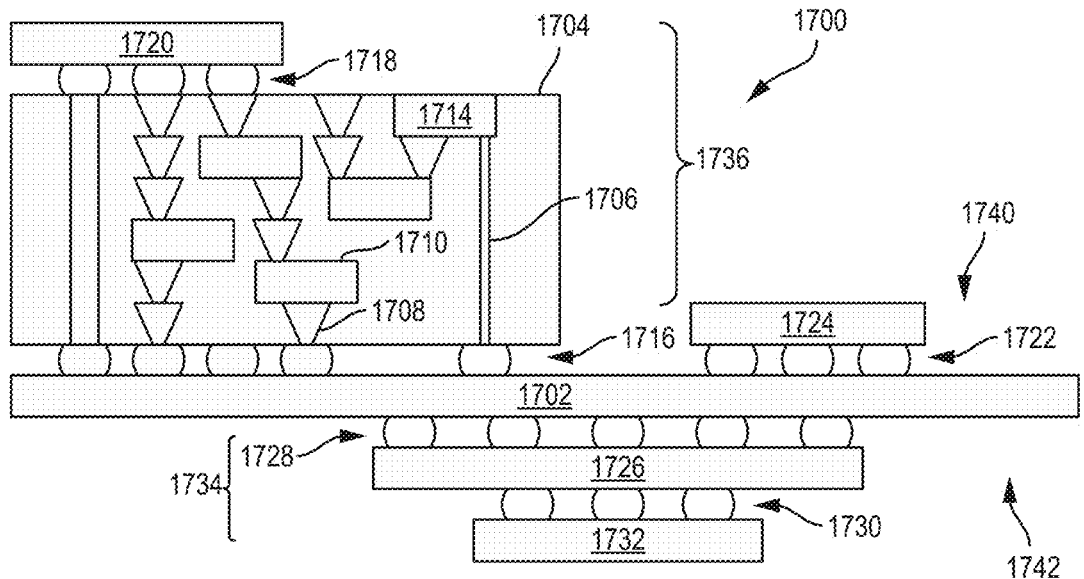
FIG. 10 is a cross-sectional side view of an IC device assembly that may include a microelectronic assembly, in accordance with any of the embodiments disclosed herein.

FIG. 10 is a cross-sectional side view of an IC device assembly 1700 that may include any of the microelectronic assemblies 300, 400 disclosed herein. In some embodiments, the IC device assembly 1700 may be a microelectronic assembly 300, 400. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any suitable ones of the embodiments of the microelectronic assemblies 300, 400 disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate. In some embodiments the circuit board 1702 may be, for example, a circuit board.

The IC device assembly 1700 illustrated in FIG. 10 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 10), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 10, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 8), an IC device (e.g., the IC device 1600 of FIG. 9), or any other suitable component. Generally, the interposer 1704 may spread a connection to a wider pitch or reroute a connection to a different connection. For example, the interposer 1704 may couple the IC package 1720 (e.g., a die) to a set of ball grid array (BGA) conductive contacts of the coupling components 1716 for coupling to the circuit board 1702. In the embodiment illustrated in FIG. 10, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 10 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 11:
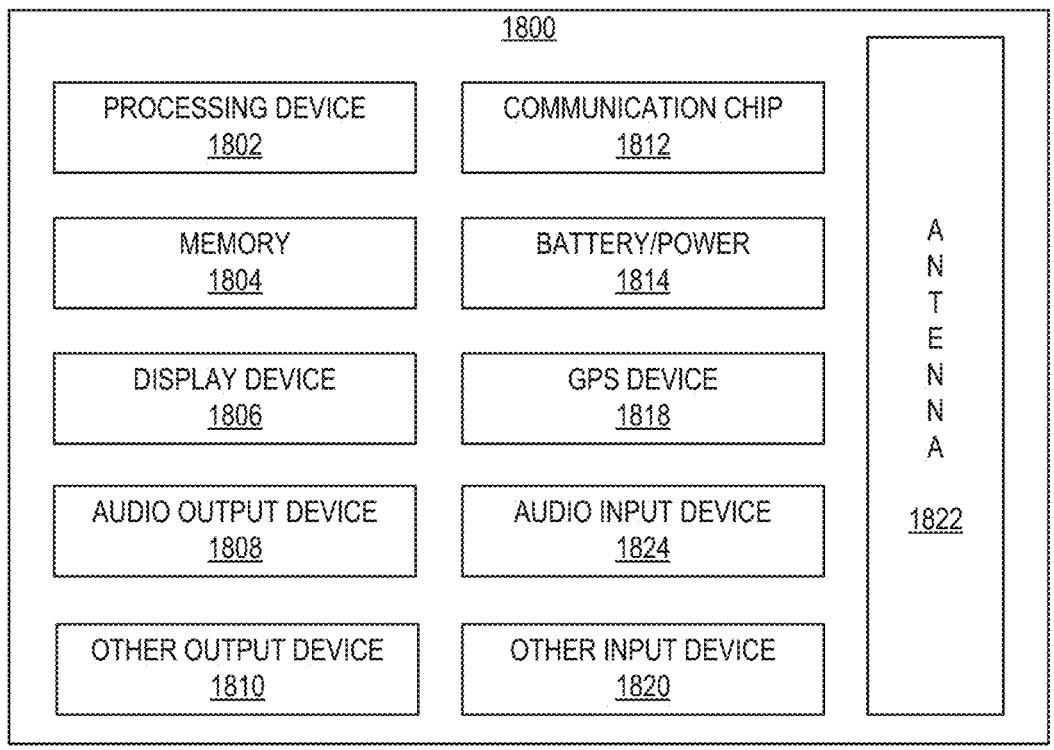
FIG. 11 is a block diagram of an example electrical device that may include a microelectronic assembly, in accordance with any of the embodiments disclosed herein.

FIG. 11 is a block diagram of an example electrical device 1800 that may include one or more of the microelectronic assemblies 300, 400 disclosed herein. For example, any suitable ones of the components of the electrical device 1800 may include one or more of the IC device assemblies 1700, IC devices 1600, or dies 1502 disclosed herein, and may be arranged in any of the microelectronic assemblies 300, 400 disclosed herein. A number of components are illustrated in FIG. 11 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 11, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-M RAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMLS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a computing device or a hand-held, portable or mobile computing device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server, or other networked computing component, a printer, a scanner, a monitor, a set-top box, an entertainment control unit, a vehicle control unit, a digital camera, a digital video recorder, or a wearable computing device. In some embodiments, the electrical device 1800 may be any other electronic device that processes data.

The following paragraphs provide various examples of the embodiments disclosed herein.

Example 1 is a microelectronic component, including a substrate having a first face and an opposing second face, wherein the substrate includes a through-substrate via (TSV); a first mold material region at the first face, wherein the first mold material region includes a first through-mold via (TMV) conductively coupled to the TSV; and a second mold material region at the second face, wherein the second mold material region includes a second TMV conductively coupled to the TSV.

Example 2 may include the subject matter of Example 1, and may further specify that the first TMV is a plurality of first TMVs having a first pitch, and wherein the second TMV is a plurality of TMVs having a second pitch different from the first pitch.

Example 3 may include the subject matter of any of Examples 1 and 2, and may further specify that the first pitch is between 90 microns and 300 microns and the second pitch is between 20 microns and 100 microns.

Example 4 may include the subject matter of any of Examples 1-3, and may further specify that a thickness of the first mold material region is between 15 microns and 40 microns.

Example 5 may include the subject matter of any of Examples 1-4, and may further specify that a thickness of the second mold material region is between 15 microns and 40 microns.

Example 6 may include the subject matter of any of Examples 1-5, and may further specify that an overall thickness of the microelectronic component is between 60 microns and 135 microns.

Example 7 may include the subject matter of any of Examples 1-6, and may further specify that a mold material of the first mold material region comprises one or more of: an organic polymer, an organic dielectric material, a fire retardant grade 4 material, a bismaleimide triazine resin, a polyimide material, a glass reinforced epoxy matrix material, a low-k dielectric, and an ultra-low-k dielectric.

Example 8 is a microelectronic assembly, including a first substrate having a first surface and an opposing second surface, wherein the first substrate includes a first through-substrate via (TSV); a microelectronic component embedded in the first substrate, the microelectronic component including: a second substrate having a first face and an opposing second face, wherein the second substrate includes a second TSV; a first mold material region at the first face, wherein the first mold material region includes a first through-mold via (TMV) conductively coupled to the second TSV; and a second mold material region at the second face, wherein the second mold material region includes a second TMV conductively coupled to the second TSV; and wherein the first mold material region is at the first surface of the first substrate and the second mold material region is at the second surface of the first substrate; and a die electrically coupled, at the second surface of the first substrate, to the first TSV and to the second TMV.

Example 9 may include the subject matter of Example 8, and may further specify that the die is a first die, wherein the first TSV is a plurality of first TSVs, and wherein the second TMV is a plurality of second TMVs, and may further include: a second die electrically coupled, at the second surface of the first substrate, to one or more of the plurality of first TSVs and to one or more of the plurality of second TMVs.

Example 10 may include the subject matter of any of Examples 8 and 9, and may further include: an insulating material around the die and in contact with the first substrate.

Example 11 may include the subject matter of Example 10, and may further specify that the insulating material is a mold material.

Example 12 may include the subject matter of any of Examples 8-11, and may further include: an underfill material at the second surface of the first substrate between the die and the first substrate.

Example 13 may include the subject matter of any of Examples 8-12, and may further specify that the first TSV is a plurality of first TSVs, and wherein the first TMV is a plurality of first TMVs, and may further include: a package substrate electrically coupled, at the first surface of the first substrate, to one or more of the plurality of first TSVs and to one or more of the plurality of first TMVs.

Example 14 may include the subject matter of any of Examples 8-13, and may further specify that the die has a first surface and an opposing second surface, and wherein the first surface of the die is electrically coupled to the first TSV and to the second TMV, and may further include: a thermal interface material on the second surface of the die.

Example 15 may include the subject matter of Example 14, and may further include: a heat spreader on the thermal interface material.

Example 16 is a computing device, including: a microelectronic assembly having a first surface and an opposing second surface, the microelectronic assembly including: a first substrate having a first surface and an opposing second surface, wherein the first substrate includes a first through-substrate via (TSV); a microelectronic component embedded in the first substrate, the microelectronic component including: a second substrate having a first face and an opposing second face, wherein the second substrate includes a second TSV; a first mold material region at the first face, wherein the first mold material region includes a first through-mold via (TMV) conductively coupled to the second TSV; and a second mold material region at the second face, wherein the second mold material region includes a second TMV conductively coupled to the second TSV; and wherein the first mold material region is at the first surface of the first substrate and the second mold material region is at the second surface of the first substrate; and a die electrically coupled, at the second surface of the first substrate, to the first TSV and to the second TMV; and a package substrate electrically coupled to the first TSV and to the first TMV at the first surface of the microelectronic assembly.

Example 17 may include the subject matter of Example 16, and may further specify that the die is a central processing unit, a radio frequency chip, a power converter, or a network processor.

Example 18 may include the subject matter of any of Examples 16 and 17, and may further specify that the computing device is a server.

Example 19 may include the subject matter of any of Examples 16-18, and may further specify that the computing device is a portable computing device.

Example 20 may include the subject matter of any of Examples 16-19, and may further specify that the computing device is a wearable computing device.

Example 21 is a method of manufacturing a microelectronic component, including: forming a first through-mold via (TMV) on a first surface of a substrate having a plurality of through-substrate vias (TSVs), wherein the first TMV is conductively coupled to one or more of the plurality of TSVs on the substrate; forming a first insulating material around the first TMV; forming a second TMV on an opposing second surface of the substrate, wherein the second TMV is conductively coupled to one or more of the plurality of TSVs on the substrate; and forming a second insulating material around the second TMV Example 22 may include the subject matter of Example 21, and may further include: planarizing the first insulating material.

Example 23 may include the subject matter of any of Examples 21 and 22, and may further include: planarizing the second insulating material.

Example 24 may include the subject matter of any of Examples 21-23, and may further specify that the second insulating material has a first face and an opposing second face, and wherein the second face of the second insulating material is in contact with the substrate, and may further include: attaching an adhesive layer to the first face of the second insulating material.

Example 25 may include the subject matter of any of Examples 21-24, and may further specify that the first insulating material or the second insulating material is a mold material.

The invention claimed is:

1. A method of manufacturing a microelectronic component, comprising:
    forming a plurality of first through-mold vias (TMVs) on a first surface of a substrate having a plurality of through-substrate vias (TSVs), wherein the plurality of first TMVs have a first pitch, and wherein at least one individual first TMV of the plurality of first TMVs is conductively coupled to one or more of the plurality of TSVs on the substrate;
    forming a first insulating material around the plurality of first TMVs;
    forming a plurality of second TMVs on an opposing second surface of the substrate, wherein the plurality of second TMVs have a second pitch different from the first pitch, and wherein at least one individual second TMV of the plurality of second TMVs is conductively coupled to one or more of the plurality of TSVs on the substrate; and
    forming a second insulating material around the plurality of second TMVs.

2. The method of claim 1, further comprising:
    planarizing the first insulating material.

3. The method of claim 1, further comprising:
planarizing the second insulating material.

4. The method of claim 1, wherein the second insulating material has a first face and an opposing second face, and wherein the second face of the second insulating material is in contact with the substrate, and further comprising:
attaching an adhesive layer to the first face of the second insulating material.

5. The method of claim 1, wherein the first insulating material or the second insulating material is a mold material.

6. The method of claim 1, wherein the first pitch is between 20 microns and 100 microns.

7. The method of claim 1, wherein the second pitch is between 90 microns and 300 microns.

8. The method of claim 1, wherein a thickness of the first insulating material is between 15 microns and 40 microns.

9. The method of claim 1, wherein a thickness of the second insulating material region is between 15 microns and 40 microns.

10. The method of claim 1, wherein an overall thickness of the microelectronic component is between 60 microns and 135 microns.

11. The method of claim 1, wherein the first insulating material or the second insulating material include one or more of: an organic polymer, an organic dielectric material, a fire retardant grade 4 material, a bismaleimide triazine resin, a polyimide material, a glass reinforced epoxy matrix material, a low-k dielectric, and an ultra-low-k dielectric.

12. The method of claim 1, wherein the substrate is a first substrate, and the method further comprising:
embedding the microelectronic component in a second substrate having a first surface and an opposing second surface with the plurality of second TMVs at the first surface of the second substrate and the plurality of first TMVs at the second surface of the second substrate; and
electrically coupling a die to one or more of the plurality of first TMVs.

13. The method of claim 12, wherein the die is a first die, and the method further comprising:
electrically coupling a second die to one or more of the plurality of first TMVs.

14. The method of claim 12, wherein the plurality of TSVs in the first substrate are a plurality of first TSVs, wherein the second substrate includes a plurality of second TSVs, and the method further comprising:
electrically coupling the die to one or more of the plurality of second TSVs.

15. A method of manufacturing a microelectronic assembly, comprising:
forming a first substrate having a first surface and an opposing second surface, the first substrate including a first through-substrate vias (TSVs);
embedding a microelectronic component in the first substrate, the microelectronic component including:
a second substrate having a first face and an opposing second face, wherein the second substrate includes a second TSV;
a first mold material region at the first face, wherein the first mold material region includes a first through-mold via (TMV) conductively coupled to the second TSV; and
a second mold material region at the second face, wherein the second mold material region includes a second TMV conductively coupled to the second TSV, and wherein the first mold material region is at the first surface of the first substrate and the second mold material region is at the second surface of the first substrate; and
electrically coupling a die, at the second surface of the first substrate, to the first TSV and to the second TMV.

16. The method of claim 15, wherein the die is a first die, wherein the first TSV is a plurality of first TSVs, and wherein the second TMV is a plurality of second TMVs, and further comprising:
electrically coupling a second die, at the second surface of the first substrate, to one or more of the plurality of first TSVs and to one or more of the plurality of second TMVs.

17. The method of claim 15, further comprising:
depositing an insulating material around the die and in contact with the first substrate.

18. The method of claim 17, wherein the insulating material is a mold material.

19. The method of claim 15, further comprising:
depositing an underfill material at the second surface of the first substrate between the die and the first substrate.

20. The method of claim 15, wherein the first TSV is a plurality of first TSVs, and wherein the first TMV is a plurality of first TMVs, and further comprising:
electrically coupling a package substrate, at the first surface of the first substrate, to one or more of the plurality of first TSVs and to one or more of the plurality of first TMVs.

* * * * *